US010651973B2

(12) United States Patent
Ge et al.

(10) Patent No.: US 10,651,973 B2
(45) Date of Patent: May 12, 2020

(54) METHOD AND APPARATUS FOR ERROR-CORRECTION ENCODING USING A POLAR CODE

(71) Applicant: HUAWEI TECHNOLOGIES CO., LTD., Shenzhen, Guangdong (CN)

(72) Inventors: Yiqun Ge, Kanata (CA); Hamid Saber, Ottawa (CA)

(73) Assignee: HUAWEI TECHNOLOGIES CO., LTD., Shenzhen (CN)

(*) Notice: Subject to any disclaimer, the term of this patent is extended or adjusted under 35 U.S.C. 154(b) by 129 days.

(21) Appl. No.: 15/921,010

(22) Filed: Mar. 14, 2018

(65) Prior Publication Data
US 2018/0278369 A1 Sep. 27, 2018

Related U.S. Application Data

(60) Provisional application No. 62/474,837, filed on Mar. 22, 2017, provisional application No. 62/500,799, filed on May 3, 2017.

(51) Int. Cl.
H04L 1/00 (2006.01)
H03M 13/00 (2006.01)
H03M 13/13 (2006.01)

(52) U.S. Cl.
CPC .......... H04L 1/0058 (2013.01); H03M 13/13 (2013.01); H03M 13/6362 (2013.01);
(Continued)

(58) Field of Classification Search
CPC . H03M 13/13; H03M 13/6362; H04L 1/0041; H04L 1/0068; H04L 1/0057; H04L 1/0058
See application file for complete search history.

(56) References Cited

U.S. PATENT DOCUMENTS

2006/0195752 A1* 8/2006 Walker .................. H04L 1/0045
714/748
2015/0194987 A1 7/2015 Li et al.
(Continued)

FOREIGN PATENT DOCUMENTS

CN 104079382 A 10/2014
CN 105049061 A 11/2015
CN 106230489 A 12/2016

OTHER PUBLICATIONS

Qualcomm Incorporated, "Polar code information bit allocation and nested extension construction" R1-1702646, 3GPP TSG-RAN WG1 Meeting #88, Feb. 13-17, 2017, Athens, Greece.
(Continued)

Primary Examiner — Guy J Lamarre

(57) ABSTRACT

An improved method of computer communication and networking with error-correction encoding and transmission using a punctured polar code construction that is based on polar code decomposition is provided. Advantageously, this allows sorting of a reliability sequence to be performed for a reduced-length vector to identify the information bit positions in the reduced-length polar code vector. Polar code decomposition is used to determine a number of information bits allocated to given reduced-length vector (e.g., $K_0$ and $K_1$). The polar code construction is a function of a puncturing pattern. In some embodiments, the puncturing pattern is a shortening pattern.

18 Claims, 16 Drawing Sheets

(52) U.S. Cl.
CPC .......... *H04L 1/0041* (2013.01); *H04L 1/0057* (2013.01); *H04L 1/0068* (2013.01)

(56) References Cited

U.S. PATENT DOCUMENTS

| | | | |
|---|---|---|---|
| 2016/0204811 | A1 | 7/2016 | Goela et al. |
| 2018/0026663 | A1* | 1/2018 | Wu ..................... H03M 13/155 714/776 |
| 2018/0175976 | A1* | 6/2018 | Kim ....................... H04L 9/0852 |
| 2018/0198564 | A1* | 7/2018 | Yang ................. H03M 13/6356 |

OTHER PUBLICATIONS

E. Arikan, "Channel Polarization: A Method for Constructing Capacity-Achieving Codes for Symmetric Binary-Input Memoryless Channels," IEEE Transactions on Information Theory, vol. 55, No. 7, 2009, pp. 3051-3073.

Tal and Vardy, "List Decoding of Polar Codes", Proceedings of the 2011 IEEE International Symposium on Information Theory, Jul. 2011, 11 pages.

R. Pedarsani, "Polar Codes: Construction and Performance Analysis", Jun. 2011, EPFL master project, 48 pages.

Mori R, Tanaka T., "Performance and Construction of Polar Codes on Symmetric Binary-Input Memoryless Channels", IEEE International Symposium on Information Theory, 2009, pp. 1496-1500.

J.Dai, K.Niu, Z.Si, J.Lin, "Evaluation and Optimization of Gaussian Approximation for Polar Codes", May 2016, 4 pages.

P. Trifonov, "Efficient Design and Decoding of Polar Codes." IEEE Transactions on Communications 60.11 (2012): pp. 3221-3227.

R1-1611254, "Details of the Polar Code Design", Huawei & HiSilicon, 3GPP TSG RAN WG1 Meeting #87, Nov. 10-14, 2016, 33 pages.

A. J. Ferrus, C. Hirche and D. Poulin, "Convolutional Polar Codes", arXiv:1704.00715, Apr. 3, 2017, 25 pages.

R1-1700089, "Performance of polar codes for control channel", Huawei & HiSilicon, 3GPP TSG RAN WG1 Ad-Hoc Meeting, Jan. 16-20, 2017.

C. Schürch, "A Partial Order for the Synthesized Channels of a Polar Code," Proc. of the IEEE Int. Symposium on Inform. Theory (ISIT), Barcelona, Spain, Jul. 2016, pp. 220-224.

M. Bardet, V. Dragoi, A. Otmani, and J.P. Tillich, "Algebraic Properties of Polar Codes From a New Polynomial Formalism," Proc. of the IEEE Int. Symposium on Inform. Theory (ISIT), Barcelona, Spain, Jul. 2016, pp. 230-234.

Presman, Noam et al. "Recursive Descriptions of Polar Codes", Advances in Mathematics of COmmunications, 60 pages, published on Jun. 18, 2015.

Presman, Noam et al. "Polar Codes with Mixed-Kernels", Information Theory Proceedings (ISIT), 2011 IEEE International Symposium, 29 pages, published Mar. 24, 2015.

Niu, Kai et al. "CRC-Aided Decoding of Polar Codes", IEEE Communications Letters vol. 16, No. 10, 4 pages, Oct. 2012.

Jincheng Dia, Kai Niu, Zhongwei Si, Chao Dong, Jiaru Ling, Does Gaussian Approximation Work Well for The Long-Length Polar Code Construction?, Mar. 16, 2017 (12 Pages).

R. Mori, et al. "Non-Binary Polar Codes using Reed-Solomon Codes and Algebraic Geomtry Codes," 2010 IEEE Inofmration Theory Workshop, 5 pages, published on Jul. 21, 2010.

R. Mori et al. "Channel Polarization on q-ary Discrete Memoryless Channels by Arbitrary Kernals", Information Theory Proceedings (ISIT), 2010 IEEE International Symposium 5 pages, published on Jul. 21, 2010.

* cited by examiner $$G_2 = \begin{bmatrix} 1 & 0 \\ 1 & 1 \end{bmatrix} \quad G_2^{\otimes 2} = \begin{bmatrix} G_2 & 0 \\ G_2 & G_2 \end{bmatrix} \quad G_2^{\otimes 3} = \begin{bmatrix} G_2 & 0 & 0 & 0 \\ G_2 & G_2 & 0 & 0 \\ G_2 & 0 & G_2 & 0 \\ G_2 & G_2 & G_2 & G_2 \end{bmatrix}$$

$$G_2^{\otimes 2} = \begin{bmatrix} 1 & 0 & 0 & 0 \\ 1 & 1 & 0 & 0 \\ 1 & 0 & 1 & 0 \\ 1 & 1 & 1 & 1 \end{bmatrix}$$

$$G_2^{\otimes 3} = \begin{bmatrix} 1 & 0 & 0 & 0 & 0 & 0 & 0 & 0 \\ 1 & 1 & 0 & 0 & 0 & 0 & 0 & 0 \\ 1 & 0 & 1 & 0 & 0 & 0 & 0 & 0 \\ 1 & 1 & 1 & 1 & 0 & 0 & 0 & 0 \\ 1 & 0 & 0 & 0 & 1 & 0 & 0 & 0 \\ 1 & 1 & 0 & 0 & 1 & 1 & 0 & 0 \\ 1 & 0 & 1 & 0 & 1 & 0 & 1 & 0 \\ 1 & 1 & 1 & 1 & 1 & 1 & 1 & 1 \end{bmatrix}$$

METHOD AND APPARATUS FOR ERROR-CORRECTION ENCODING USING A POLAR CODE

CROSS-REFERENCE TO RELATED APPLICATIONS

The present application claims the benefit of U.S. Provisional Application No. 62/474,837, filed on Mar. 22, 2017, entitled "POLAR CODE CONSTRUCTION WITH SHORT RELIABILITY SEQUENCE AND PUNCTURING", and U.S. Provisional Application No. 62/500,799, filed on May 3, 2017, entitled "POLAR CODE CONSTRUCTION WITH SHORT RELIABILITY SEQUENCE AND PUNCTURING OR SHORTENING", the entire contents of both of which are incorporated herein by reference.

FIELD

The present disclosure relates to generally to communications and, in particular, to error-correction encoding based on polar codes.

BACKGROUND

Polar codes are proposed as channel codes for use in future wireless communications. These codes are competitive with state-of-the-art error correction codes and have low encoding complexity. See E. Arikan, "Channel polarization: A method for constructing capacity-achieving codes for symmetric binary-input memoryless channels," IEEE Trans. Inf. Theory, vol. 55, no. 7, pp. 3051-3073, 2009. Successive Cancellation List (SCL) decoding is one option for decoding polar coded information.

Based on channel polarization, Arikan designed a channel code that is proven to reach channel capacity. Polarization refers to a coding property that, as code length increases to infinity, bit-channels polarize and their capacities approach either zero (completely noisy channel) or one (completely perfect channel). The fraction of perfect bit-channels is equal to the capacity of this channel.

SUMMARY

Embodiments of the present invention provide an improved method of error-correction encoding by using a punctured polar code based on polar code decomposition. Advantageously, this allows sorting of a reliability sequence to be performed for a reduced-length vector to identify the information bit positions in the reduced-length polar code vector. Polar code decomposition is used to determine a number of information bits allocated to given reduced-length vector (e.g., $K_0$ and $K_1$).

The claimed invention relates to computer networking technology, both in the nature of the transmission, namely over a physical channel, and the purpose, namely to improve reliability of transmission over the physical channel.

The claimed invention relates to specific methods and apparatuses for improving technology, namely communication over a physical channel. Also, note that the claimed invention does not pre-empt error control coding in its entirety. The disclosure does not cover the generic desired result of "using control coding to improve reliability", but rather relates to specific apparatuses and methods, including improvements in polar coding and the implementation of polar coding, to improve transmission reliability.

The specific encoder implemented in the transmitting device is what improves the reliability of the transmission, such that the functionality of the transmitting device is improved. As reliability is sufficiently increased, transmission errors (e.g. caused by noise and interference) can be corrected at the receiver/decoder without the need for re-transmission of payload data. Therefore, improvements in the encoder, and improvement in the reliability of the encoded payload/message in particular, will improve system latency and throughput. The transmitting device will have increased transmit capacity as a result of not having to re-transmit as often. The encoding method claimed does not simply transform the data into a transmittable form; rather, the claimed methods and apparatuses improve the reliability of the transmission and therefore the functioning of the transmitting device.

The construction of a given polar code used for error-correction encoding may be a function of a puncturing pattern. In some embodiments, the puncturing pattern is a shortening pattern.

Embodiments of the present invention provide an improved method of error-correction encoding using a punctured polar code construction based on polar code decomposition. Advantageously, this allows sorting of a reliability sequence to be performed for a reduced-length vector to identify the information bit positions in the reduced-length polar code vector. Polar code decomposition is used to determine a number of information bits allocated to given reduced-length vector (e.g., $K_0$ and $K_1$).

The performance of a polar code, and consequently the reliability of the transmission, may be sensitive to puncturing because of the polarization of the sub-channel reliabilities in the polar code. In the embodiments of the present invention, the calculation of the number of information bits allocated to a given reduced-length vector is based on a puncturing pattern of the mother polar code. Basing the information bit length calculation at least in part on the puncturing pattern improves the performance of polar codes designed according to polar code decomposition methods.

According to one aspect of the present invention, there is provided a method comprising: for use in transmitting on a channel with a channel capacity C, constructing a polar code defined by K, M, N, P, C, where K is an input information vector bit length, N is a mother polar code length, M is an output codeword bit length after puncturing using a puncturing pattern P, and C is a channel capacity, the method comprising: performing at least one iteration of polar code decomposition, performing the first iteration comprising performing code decomposition based on K, M, N, P, C defining the polar code, and performing subsequent iterations comprising two code decompositions based on $$(K = K_0, M = M_0, N = \frac{N}{2}, P = P_0, C = C_0),$$

$$(K = K_1, M = M_1, N = \frac{N}{2}, P = P_1, C = C_1)$$

of the previous iteration; wherein performing polar code decomposition comprises: determining respective input information vector bit lengths $K_0$ and $K_1$ for two partial polar codes of length N/2 based on the puncturing pattern P; and the method further comprising determining information bit positions for the polar code based on at least one reliability sequence and on the information bit lengths determined in a last of the at least one iteration of polar code decomposition; polar code encoding a set of information bits using a polar code encoder configured with the information bit positions determined in the last of the at least one iteration of polar code decomposition; transmitting based on a result of the polar code encoding over the channel using the constructed polar code.

Optionally, the method further comprises determining respective puncturing patterns $P_0$, $P_1$ for the two polar codes of length N/2 based on the puncturing pattern P; determining respective punctured codeword lengths $M_0$, $M_1$ for the two polar codes based on the puncturing patterns; and determining respective capacities $C_0$, $C_1$ for the two polar codes based on the respective determined punctured codeword lengths and the channel capacity C; wherein determining the respective input information vector bit lengths $K_0$ and $K_1$ is based on at least one of the determined punctured codeword lengths $M_0$, $M_1$ and at least one of the determined capacities $C_0$, $C_1$.

Optionally, determining respective puncturing patterns $P_0$, $P_1$ for two polar codes of length N/2 based on the puncturing pattern P is performed according to:

$$P_0 = P\left(1:\frac{N}{2}\right) \otimes P\left(\frac{N}{2}+1:N\right)$$

$$P_1 = P(1:N/2) \oplus P(N/2+1:N)$$

Optionally, determining respective punctured codeword lengths $M_0$, $M_1$ for the two polar codes based on the puncturing patterns is performed according to:

$$M_0 = \omega(P_0)$$

$$M_1 = M - M_0$$

where $\omega(P_0)$ is Hamming weight of $P_0$.

Optionally, determining respective capacities $C_0$, $C_1$ for the two polar codes based on the respective determined punctured codeword lengths and the channel capacity C is performed according to:

$$C_0 = 2C - C^+$$

$$C_1 = \frac{M_0}{M_1}C^+ + \frac{M - 2M_0}{M_1}C$$

where $C^+$ is capacity of polar code repetition channel.

Optionally, bit reversal puncturing is employed, and determining respective capacities $C_0$, $C_1$ for the two polar codes based on the respective determined punctured codeword lengths and the channel capacity C is performed according to:

$$C_1 = \begin{cases} C^+ & M \text{ even} \\ \cong C^+ & M \text{ odd} \end{cases}$$

where $C^+$ is the capacity of polar code repetition channel.

Optionally, natural puncturing is employed, and determining respective capacities $C_0$, $C_1$ for the two polar codes based on the respective determined punctured codeword lengths and the channel capacity C is performed according to:

$$C_1 = \begin{cases} C, & \text{if } M \leq \frac{N}{2} \\ \frac{M}{2^{n-1}}(C^+ - C) - C^+, & \text{if } M > N/2 \end{cases}$$

where $C^+$ is the capacity of polar code repetition channel.

Optionally, determining the respective input information vector bit lengths $K_0$ and $K_1$ for the two polar codes is performed according to:

$$K_0 = M_0 C_0$$

$$K_1 = K - K_0$$

Optionally, the method further comprises determining a revised channel capacity for the physical channel; updating the polar code construction using the revised channel capacity; encoding and transmitting using the updated polar code construction.

Optionally, the method further comprises updating the constructed polar code based one or a combination of: Revised K; Revised N; Revised M; Revised P; Revised channel capacity.

Optionally, performing at least one iteration of polar code deconstruction comprises performing iterations in sequence for N=N, N/2, N/4, ... N/$N_{ref}$, and wherein determining information bit positions is performed for the polar codes of length N/$N_{ref}$.

Optionally, the puncturing pattern P is a shortening pattern S.

Optionally, determining respective puncturing patterns $P_0$, $P_1$ for two polar codes of length N/2 based on the puncturing pattern P comprises determining respective shortening patterns $S_0$, $S_1$ for the two polar codes of length N/2 based on the shortening pattern S performed according to:

$$S_0 = S(1:N/2) \oplus S(N/2+1:N)$$

$$S_1 = S(N/2+1:N)$$

Optionally, determining respective punctured codeword lengths $M_0$, $M_1$ for the two polar codes based on the puncturing patterns is performed according to:

$$M_0 = \omega(S_0)$$

$$M_1 = M - M_0$$

where $\omega(P_0)$ is Hamming weight of $S_0$.

Optionally, determining respective capacities $C_0$, $C_1$ for the two polar codes based on the respective determined shortened codeword lengths and the channel capacity C is performed according to:

$$C_0 = \frac{M}{M_0}C - \frac{M_1}{M_0}C^+$$

$$C_1 = C^+$$

where $C^+$ is the capacity of polar code repetition channel.

Optionally, bit reversal shortening is employed, and determining respective capacities $C_0$, $C_1$ for the two polar codes based on the respective determined shortened codeword lengths and the channel capacity C is performed according to:

$$C_0 = \begin{cases} 2C - C^+ & M \text{ even} \\ \cong 2C - C^+ & M \text{ odd} \end{cases}$$

where $C^+$ is the capacity of polar code repetition channel.

Optionally, natural shortening is employed, and determining respective capacities $C_0$, $C_1$ for the two polar codes based on the respective determined shortened codeword lengths and the channel capacity C is performed according to:

$$C_0 \begin{cases} C, \text{ if } M \leq \dfrac{N}{2} \\ \dfrac{M}{2^{n-1}}(C - C^+) + C^+, \text{ if } M > N/2 \end{cases}$$

where $C^+$ is the capacity of polar code repetition channel.

Optionally, determining the respective input information vector bit lengths $K_0$ and $K_1$ for the two polar codes is performed according to:

$$K_1 = M_1 C_1$$

$$K_0 = K - K_1$$

Optionally, the reliability sequences are such that disabled sub-channels are determined to be frozen sub-channels.

Optionally, the method further comprises determining disabled sub-channels by performing iterations of puncturing pattern evolution until puncturing patterns of length 1 are determined, with a puncturing pattern of 0 indicating a disabled sub-channel.

Optionally, the method further comprises encoding based on the constructed polar code.

Optionally, the method further comprises updating the constructed polar code based one or a combination of: Revised K; Revised N; Revised M; Revised S; Revised channel capacity.

Optionally, determining information bit positions for the polar code based on at least one reliability sequence and on the information bit lengths determined in a last of the at least one iteration of polar code decomposition comprises: using a respective reliability sequence for each punctured codeword length determined in the last of the at least one iteration of polar code construction.

According to another aspect of the present invention, there is provided a method of communication using a polar code defined by K, N, P, where K is an input information vector bit length, N is a mother polar code length, and P is a puncturing pattern, the method comprising: performing at least one iteration of polar code decomposition, performing the first iteration comprising performing code decomposition based on K, N, P defining the polar code, and performing subsequent iterations comprising two code decompositions based on $$\left(K = K_0, N = \frac{N}{2}\right), \left(K = K_1, N = \frac{N}{2}\right)$$

of the previous iteration; wherein performing polar code decomposition comprises determining respective input information vector bit lengths $K_0$ and $K_1$ for two partial polar codes of length N/2 based on the puncturing pattern P; and the method further comprising determining information bit positions for the polar code based on at least one reliability sequence and on the information bit lengths determined in a last of the at least one iteration of polar code decomposition; polar code encoding a set of information bits using a polar code encoder configured with the information bit positions determined in the last of the at least one iteration of polar code decomposition; transmitting based on a result of the polar code encoding over a channel using the constructed polar code.

Optionally, the polar code is further defined by M, C, where M is an output codeword bit length after puncturing using the puncturing pattern P, and C is a channel capacity, and the method further comprises: performing code decomposition based on K, M, N, P, C defining the polar code, and performing subsequent iterations comprising two code decompositions based on $$\left(K = K_0, M = M_0, N = \frac{N}{2}, P = P_0, C = C_0\right),$$

$$\left(K = K_1, M = M_1, N = \frac{N}{2}, P = P_1, C = C_1\right)$$

of the previous iteration; determining respective puncturing patterns $P_0$, $P_1$ for the two polar codes of length N/2 based on the puncturing pattern P; determining respective punctured codeword lengths $M_0$, $M_1$ for the two polar codes based on the puncturing patterns; and determining respective capacities $C_0$, $C_1$ for the two polar codes based on the respective determined punctured codeword lengths and the channel capacity C; wherein determining the respective input information vector bit lengths $K_0$ and $K_1$ is based on at least one of the determined punctured codeword lengths $M_0$, $M_1$ and at least one of the determined capacities $C_0$, $C_1$.

According to another aspect of the present invention, there is provided a method of constructing a polar code defined by K, M, N, P, where K is an input information vector bit length, N is a mother polar code length, M is an output codeword bit length after puncturing using a puncturing pattern P, the method comprising: performing a plurality of iterations of polar code puncturing pattern evolution, performing the first iteration comprising performing polar code puncturing pattern evolution based on the puncturing pattern P to determine respective puncturing patterns $P_0$, $P_1$ for two polar codes of length N/2, and performing subsequent iterations comprising two polar code puncturing pattern evolutions based on $P_0$, $P_1$, N=N/2 of the previous iteration, until N/2=1; wherein after the iterations, there are N polar codes of length 1 each corresponding to a respective input bit position, and for each input bit position, if the puncturing pattern of the corresponding length 1 polar code is one, that bit position is an information bit position, and if the puncturing pattern of the corresponding length 1 polar code is zero, that bit is a frozen bit position, with the plurality of iterations of polar code puncturing pattern evolution being used to identify N-M frozen input bit positions; using at least one reliability sequence to determine K information bit positions from among remaining M input bit positions.

Optionally, determining respective puncturing patterns $P_0$, $P_1$ for two polar codes of length N/2 based on the puncturing pattern P is performed according to:

$$P_0 = P\left(1:\frac{N}{2}\right) \otimes P\left(\frac{N}{2}+1:N\right)$$

$$P_1 = P(1:N/2) \oplus P(N/2+1:N)$$

Optionally, determining respective puncturing patterns $P_0$, $P_1$ for two polar codes of length N/2 based on the puncturing pattern P comprises determining respective shortening patterns $S_0, S_1$ for the two polar codes of length N/2 based on the shortening pattern S performed according to:

$$S_0 = S(1:N/2) \oplus S(N/2+1:N)$$

$$S_1 = S(N/2+1:N).$$

According to another aspect of the present invention, there is provided an encoder configured to encode using a polar code constructed as summarized above or described herein.

According to another aspect of the present invention, there is provided an encoder comprising: a polar code constructor configured to construct a polar code using one of the methods as summarized above or described herein; a polar code encoder configured to perform polar code encoding using the constructed polar code.

According to another aspect of the present invention, there is provided an apparatus comprising: a polar code constructor configured to construct, for use in transmitting on a channel with a channel capacity C, a polar code defined by K, M, N, P, C, where K is an input information vector bit length, N is a mother polar code length, M is an output codeword bit length after puncturing using a puncturing pattern P, and C is a channel capacity, by: performing at least one iteration of polar code decomposition, performing the first iteration comprising performing code decomposition based on K, M, N, P, C defining the polar code, and performing subsequent iterations comprising two code decompositions based on $$\left(K=K_0, M=M_0, N=\frac{N}{2}, P=P_0, C=C_0\right),$$

$$\left(K=K_1, M=M_1, N=\frac{N}{2}, P=P_1, C=C_1\right)$$

of the previous iteration, wherein performing polar code decomposition comprises determining respective input information vector bit lengths $K_0$ and $K_1$ for two partial polar codes of length N/2 based on the puncturing pattern P; and determining information bit positions for the polar code based on at least one reliability sequence and on the information bit lengths determined in a last of the at least one iteration of polar code decomposition; a polar code encoder configured with the information bit positions determined in the last of the at least one iteration of polar code decomposition to perform polar code encoding of a set of information bits using the constructed polar code; a transmitter, coupled to the polar code encoder, configured to transmit based on a result of the polar code encoding over the channel using the constructed polar code.

Optionally, the polar code constructor is further configured to: determine respective puncturing patterns $P_0$, $P_1$ for the two polar codes of length N/2 based on the puncturing pattern P; determine respective punctured codeword lengths $M_0$, $M_1$ for the two polar codes based on the puncturing patterns; determine respective capacities $C_0$, $C_1$ for the two polar codes based on the respective determined punctured codeword lengths and the channel capacity C; and determine the respective input information vector bit lengths $K_0$ and $K_1$ based on at least one of the determined punctured codeword lengths $M_0$, $M_1$ and at least one of the determined capacities $C_0$, $C_1$.

Optionally, the polar code constructor is further configured to determine a revised channel capacity for the physical channel and to update the polar code construction using the revised channel capacity; the polar code encoder is configured to encode using the updated polar code construction; and the transmitter is configured to transmit using the updated polar code construction.

Optionally, the polar code constructor is further configured to update the constructed polar code based one or a combination of: Revised K; Revised N; Revised M; Revised P; Revised channel capacity.

Optionally, the polar code constructor is configured to perform iterations of polar code deconstruction in sequence for N=N, N/2, N/4, . . . N/$N_{ref}$, and to determine the information bit positions for the polar codes of length N/$N_{ref}$.

Optionally, the puncturing pattern P is a shortening pattern S.

Optionally, the reliability sequences are such that disabled sub-channels are determined to be frozen sub-channels.

Optionally, the polar code constructor is further configured to determine disabled sub-channels by performing iterations of puncturing pattern evolution until puncturing patterns of length 1 are determined, with a puncturing pattern of 0 indicating a disabled sub-channel.

Optionally, the polar code constructor is configured to determine information bit positions for the polar code based on at least one reliability sequence and on the information bit lengths determined in a last of the at least one iteration of polar code decomposition by: using a respective reliability sequence for each punctured codeword length determined in the last of the at least one iteration of polar code construction.

According to another aspect of the present invention, there is provided an apparatus comprising: a polar code constructor configured to construct, for communication over a channel, a polar code defined by K, N, P, where K is an input information vector bit length, N is a mother polar code length, and P is a puncturing pattern, by: performing at least one iteration of polar code decomposition, performing the first iteration comprising performing code decomposition based on K, N, P defining the polar code, and performing subsequent iterations comprising two code decompositions based on $$\left(K=K_0, N=\frac{N}{2}\right), \left(K=K_1, N=\frac{N}{2}\right)$$

of the previous iteration, wherein performing polar code decomposition comprises determining respective input information vector bit lengths $K_0$ and $K_1$ for two partial polar codes of length N/2 based on the puncturing pattern P; and determining information bit positions for the polar code based on at least one reliability sequence and on the information bit lengths determined in a last of the at least one iteration of polar code decomposition; a polar code encoder configured with the information bit positions determined in the last of the at least one iteration of polar code decomposition to perform polar code encoding of a set of information bits using the constructed polar code; a transmitter, coupled to the polar code encoder, configured to transmit based on a result of the polar code encoding over the channel using the constructed polar code.

Optionally, the polar code is further defined by M, C, where M is an output codeword bit length after puncturing using the puncturing pattern P, and C is a channel capacity, and the polar code constructor is further configured to: perform code decomposition based on K, M, N, P, C defining the polar code, and perform subsequent iterations comprising two code decompositions based on $$\left(K = K_0, M = M_0, N = \frac{N}{2}, P = P_0, C = C_0\right),$$
$$\left(K = K_1, M = M_1, N = \frac{N}{2}, P = P_1, C = C_1\right)$$

of the previous iteration; determine respective puncturing patterns $P_0$, $P_1$ for the two polar codes of length N/2 based on the puncturing pattern P; determine respective punctured codeword lengths $M_0$, $M_1$ for the two polar codes based on the puncturing patterns; determine respective capacities $C_0$, $C_1$ for the two polar codes based on the respective determined punctured codeword lengths and the channel capacity C; and determine the respective input information vector bit lengths $K_0$ and $K_1$ based on at least one of the determined punctured codeword lengths $M_0$, $M_1$ and at least one of the determined capacities $C_0$, $C_1$.

BRIEF DESCRIPTION OF THE DRAWINGS

Embodiments of the disclosure will now be described with reference to the attached drawings in which:

FIG. 1 is a diagram showing one example of how a polar coding generator matrix can be produced from a kernel;

DETAILED DESCRIPTION

FIG. 1 is a diagram showing, by way of an illustrative example, how a polar coding generator matrix can be produced from a kernel $G_2$ 100. Note that FIG. 1 is an example. In the present disclosure, other forms of kernel are also considered. Polarization comes from the "nested" way in which a generator matrix is created from a kernel (or combination of kernels), in accordance with an aspect of the present disclosure.

The 2-fold Kronecker product matrix $G_2 \otimes^2$ 102 and the 3-fold Kronecker product matrix $G_2 \otimes^3$ 104 in FIG. 1 are examples of polar coding generator matrices. The generator matrix approach illustrated in FIG. 1 can be expanded to produce an m-fold Kronecker product matrix $G_2 \otimes^m$.

Figure 2A:
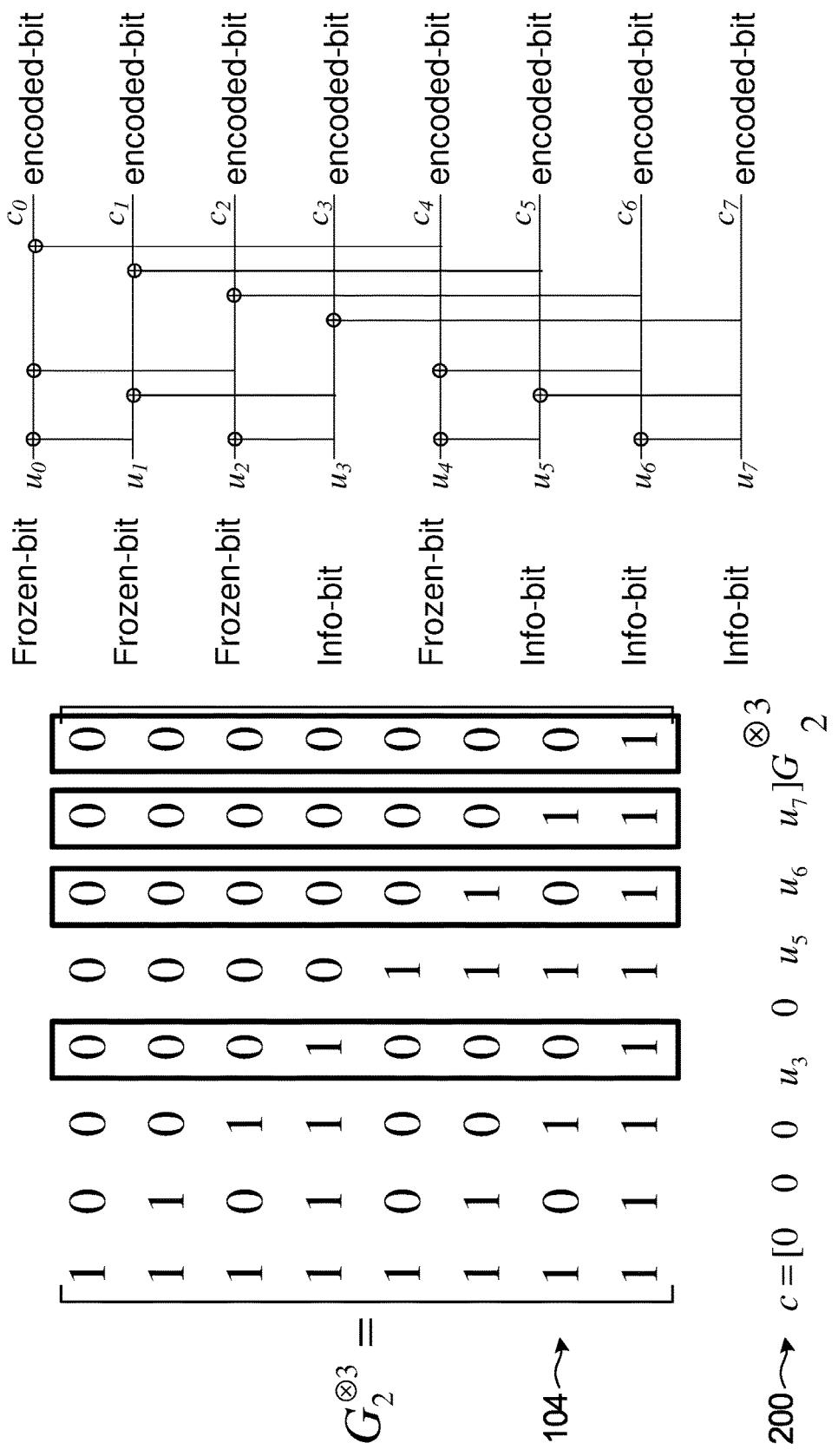
FIG. 2A is a diagram showing an example use of a polar coding generator matrix for producing codewords and a schematic illustration of an example polar encoder.

A polar code can be formed from a Kronecker product matrix based on matrix $G_2$ 100. For a polar code having codewords of length $N=2^m$, the generator matrix is $G_2 \otimes^m$ FIG. 2 is a diagram showing an example use of a polar coding generator matrix for producing codewords and a schematic illustration of an example polar encoder. In FIG. 2A, the generator matrix $G_2 \otimes^3$ 104 is used to produce codewords of length $2^3=8$. A codeword c is formed by the product of an input vector $u=[0\ 0\ 0\ u_3\ 0\ u_5\ u_6\ u_7]$ and the generator matrix $G_2 \otimes^3$ 104 as indicated at 200. The input vector u is composed of information bits and fixed or frozen bits. In the specific example shown in FIG. 2, N=8, so the input vector u is an 8-bit vector, and the codeword c is an 8-bit vector. The input vector has frozen bits in positions 0, 1, 2 and 4, and has information bits at positions 3, 5, 6, and 7. An example implementation of an encoder that generates codewords is indicated at 212, where the frozen bits are all set to 0, and the circled "+" symbols represent modulo 2 addition. For the example of FIG. 2, an N=8-bit input vector is formed from K=4 information bits and N−K=4 frozen bits. Codes of this form are referred to as polar codes and the encoder is referred to as a polar encoder. Decoders for decoding polar codes are referred to as polar decoders. Frozen bits are set to zero in the example shown in FIG. 2A. However, frozen bits could be set to other bit values that are known directly, or indirectly derived, to both an encoder and a decoder. For ease of description, all-zero frozen bits are considered herein.

Figure 2B:
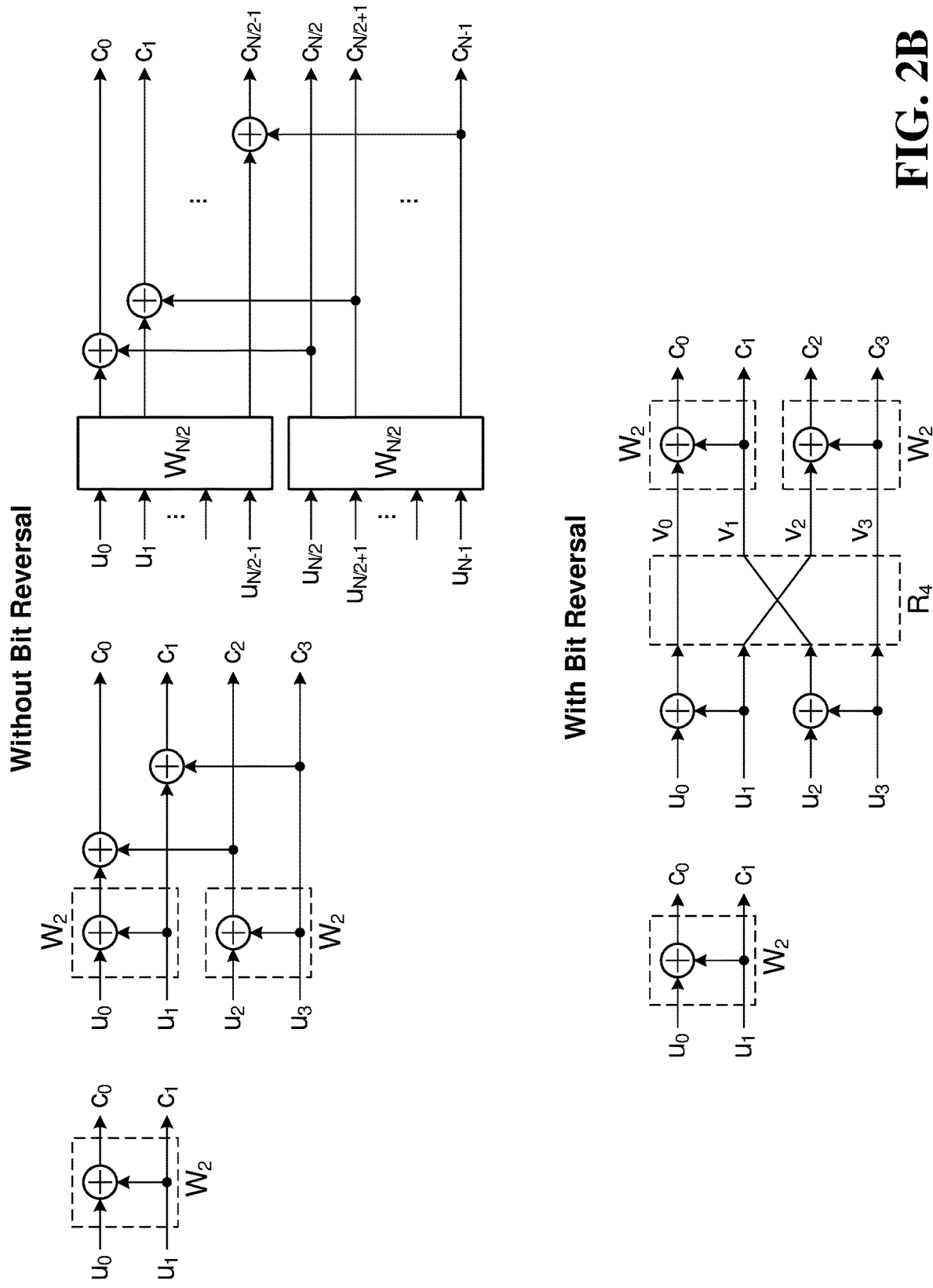
FIG. 2B includes block diagrams that illustrate polar coding without bit reversal and with bit reversal.

FIG. 2B includes block diagrams that illustrate polar coding without bit reversal and with bit reversal. The example polar encoder in FIG. 2A is without bit reversal, and is consistent with the example 2-by-2 kernel and higher-order encoder examples at the top of FIG. 2B. Bit reversal might not change the structure of a kernel, as shown in FIG. 2B with the same 2-by-2 kernel for the examples without and with bit reversal. An example of higher-order polar encoder with 2-by-2 kernels and bit reversal represented at $R_4$, is shown at the bottom right of FIG. 2B.

In more general terms, the output of a polar encoder is $x_0^{N-1} = u_0^{N-1} G_N$, where $G_N = F^{\otimes n}$ is an N-by-N generator matrix, $N = 2^n$, $n \geq 1$, and $F = G_2$ 100 in FIG. 1. For bit reversal, $G_N = B_N F^{\otimes n}$, where $B_N$ is an N-by-N bit-reversal permutation matrix.

Embodiments disclosed herein could be implemented without or with bit reversal.

In polar code construction, ideally the more "reliable" positions of an input vector are used to carry the information bits, and the more "unreliable" positions of an input vector are used to carry the frozen bits (i.e., bits already known to both encoder and decoder). However, when information is transmitted over a physical channel, the reliability of a given bit position is also a function of the characteristics of the physical channel, such as the erasure rate of the physical channel. A reliability sequence (reliable and unreliable positions) may be calculated based on assumed characteristics of the physical channel before the information is transmitted over the channel. In theory, the frozen bits can be set to any value so long as the location of each frozen bit is known to both the encoder and the decoder. In conventional applications, the frozen bits are all set to zero.

With a sufficiently long code length, a code designed according to polarization theory can reach the channel capacity in a binary memoryless channel if a Successive Cancellation (SC) decoding algorithm is used. A very simple SC decoding algorithm was analyzed and simulated by Arikan.

In practice, a code length cannot be infinite and a channel cannot be a binary memoryless channel, and therefore channel capacity cannot be reached by such a simple SC decoder. According to Arikan, the channel capacity can be approached when using SC decoding if a code length is over $2^{20}$ bits in an Additive White Gaussian Noise (AWGN) channel. Such a long code length is impractical in wireless communications, for example.

Redundancy bits such as error-detecting code (EDC) bits and/or error-correcting code (ECC) bits can also be included in the input vector to assist in decoding. A cyclic redundancy check (CRC) code is an example of an EDC that could be used to assist in decoding. More than one EDC or ECC could be used within one codeword. However, it should be understood that other EDCs and ECCs, such as a checksum code or a Fletcher Code, may be used. When certain bits are used to assist in decoding, these bits are known as assistant bits.

CRC bits, for example, are generated based on the information bits being transmitted. CRC bits are generally placed in the more reliable positions in the input vector, although CRC bits may also be placed in other positions in the input vector. CRC bits may be used in path selection for List decoding, for example, to improve polar code performance. During encoding, an N-bit input vector could be formed from K information bits, including one or more CRC bits, and (N−K) frozen bits. In this example, starting with a number of input bits, a CRC is calculated and appended to the input bits to produce a set of information bits including the input bits and the CRC bits. The remaining (N−K) frozen bits are inserted to produce an N-bit input vector, where N is a power of 2 in an Arikan polar code. The input vector is then multiplied by a generator matrix for a polar code to produce an N-bit codeword.

The codeword is transmitted over a channel, and a receiver, in turn, receives a word. Due to channel effects such as noise, the received word might not be identical to the transmitted codeword. A decoder attempts to decode the received word to determine information bits in the original input vector.

During decoding of a codeword encoded from an input vector, the locations and values of frozen bits in the input vector are treated as known. Conversely, the values of the information and assistant bits are unknown. For descriptive simplicity, bits of the input vector that are not known to the decoder in advance will be referred to as "information" bits. Thus, "information bits" as used herein may also be known as "unknown" bits or "unfrozen" bits. Moreover, for greater clarity, "information bits" as used herein may include upper-layer data to be transmitted, as well as EDC bits, ECC bits, and/or other forms of assistant bits generated from the upper-layer data.

For example, the information bits may include CRC bits. Some polar decoders use SC decoding as noted above, in which the information bits are decoded sequentially and successive cancellation is applied. Once a particular decision has been made regarding how an information bit is to be decoded, SC polar decoders do not allow that bit to be changed or corrected, and the decoder moves on to decoding the next information bit.

Returning to encoding, a Kronecker matrix (generator matrix) is a lower triangular matrix, which means that the first sub-channel is distributed on all of the coded bits and the last sub-channel is distributed only on the last bit. This implies that the reliability of the last sub-channel is higher than that of the first sub-channel. This characteristic is quite different from other channel coding schemes, in which an encoder equally "distributes" all information bits into a codeword.

While this inherent property of polar codes forms the basis of polar encoding and decoding, the polarization of the sub-channel reliabilities also creates significant technical challenges when implementing a practical polar encoder. In particular, though rate-matching is a desirable feature to have in a practical polar encoder, its implementation presents difficulties. The encoding rate refers to the ratio of information bits to total bits in the codeword outputted from the polar encoder. A common rate-matching approach, known as "puncturing," involves generating an N-bit codeword from a polar encoder of length N, and then only transmitting a subset, M, of the N-bit codeword. In other words, the N−M punctured encoded bits are discarded.

Due to the polarization of the sub-channel reliabilities inherent to polar coding, the performance of a polar code could be more sensitive to puncturing (including the special case where the puncturing is shortening) than other types of channel coding schemes. In comparison, because every coded bit in a convolutional code or an LDPC code is related to all information bits, even after some coded bits are punctured a convolutional or LDPC decoder can still recover all information bits from the coded bits that remain after puncturing. When designing a puncturing scheme for polar code, this puncturing sensitivity characteristic and the relevance between punctured bits and sub-channels should be carefully considered.

The general notation of (K, M, N, P, C) is used herein to denote the polar code and the communication scenario. K is the length of an information vector bit length. The information vector is encoded with a mother polar code having length $N=2^n$ to produce a polar code codeword. Such a polar code will have a frozen set of size N−K. The polar code codeword is punctured based on a puncturing pattern P which is a N×1 binary vector. The elements of P with zero values indicate punctured code bits positions. M is the length* of the codeword after puncturing. The Hamming weight of the puncturing pattern P is equal to M. The capacity of the channel that the polar code is used on is denoted by C.

Figure 3A:
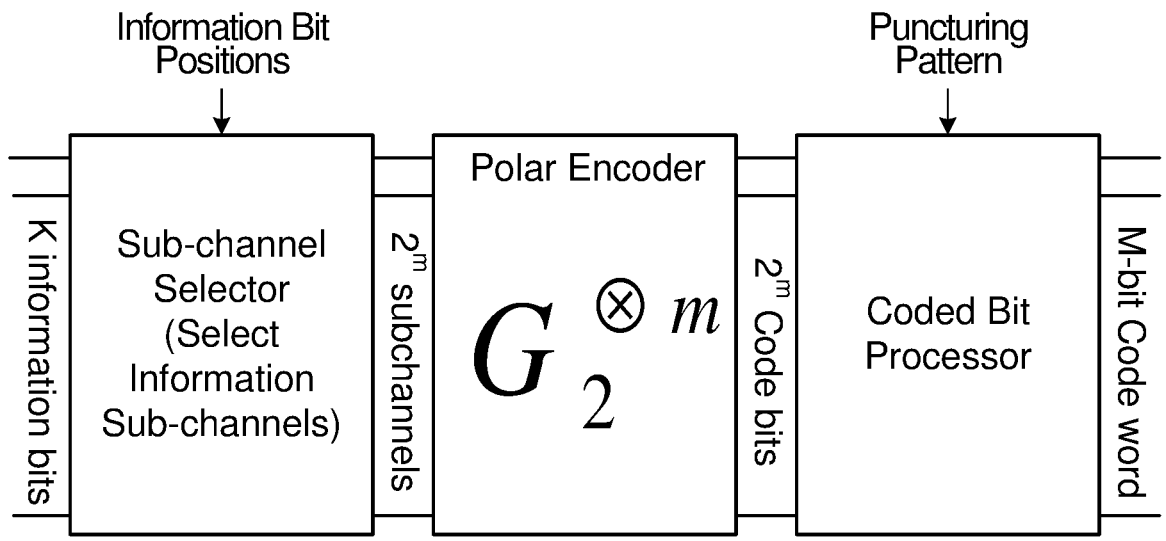
FIG. 3A is a block diagram illustrating an example of a rate-matching polar encoder based on 2-by-2 kernel, which includes a sub-channel selector, a polar encoder and coded-bit processor.

FIG. 3A is a block diagram illustrating an example of a rate-matching polar encoder provided by an embodiment of the invention, which includes a sub-channel selector, a polar encoder and a coded-bit processor. The example in FIG. 3A is based on a 2-by-2 kernel, K information bits, M-bit codeword, and R=K/M code rate that is achieved by puncturing by the coded bit processor using puncturing pattern P in the coded bit processor. An input to the sub-channel selector is a set of information bit positions determined using one of the polar code constructions methods described below. Alternatively, the frozen bit positions may be determined and input to the sub-channel selector since the information bit positions can be trivially derived from the frozen bit positions, and vice versa. An input to the coded bit processor is the puncturing pattern P.

Puncturing

Figure 3B:
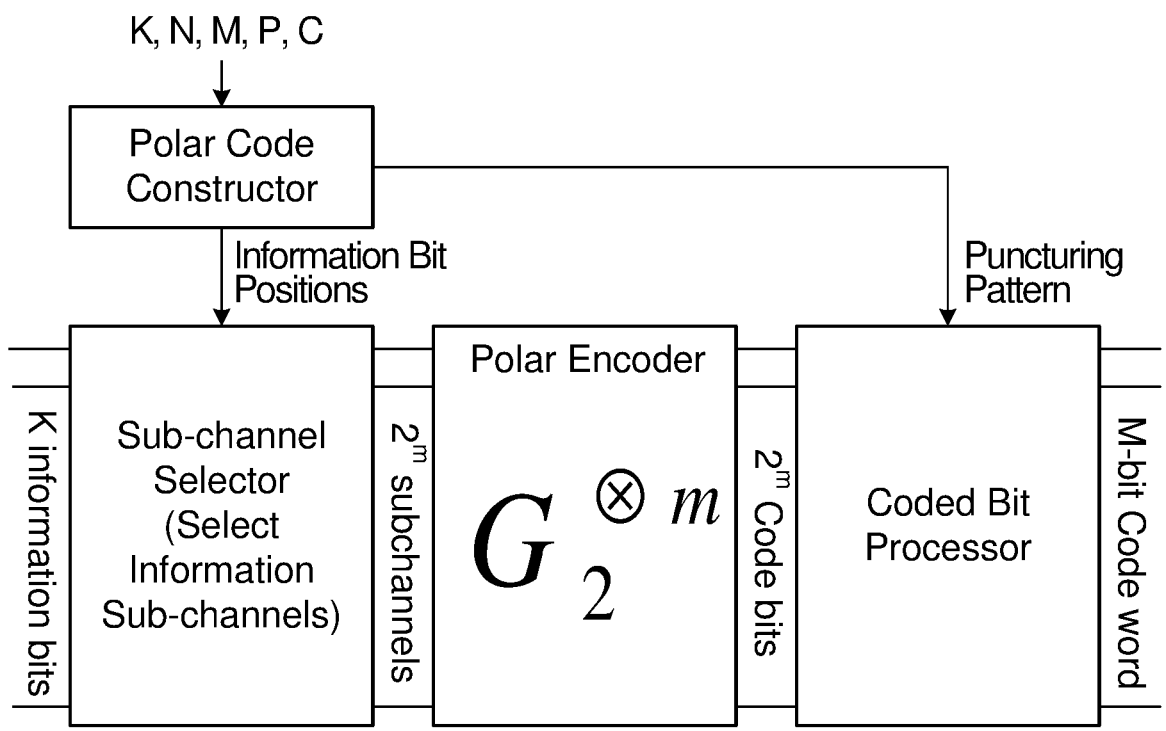
FIG. 3B is a block diagram illustrating an example of a rate-matching polar encoder similar to that of FIG. 3A, also including a polar code constructor.

FIG. 3B is a block diagram illustrating an example of a rate-matching polar encoder provided by another embodiment of the invention, where puncturing is performed in the transmitter. This example is similar to that of FIG. 3B, but also includes a polar code constructor which determines the information bit positions based on input parameters that include one or more of K, N, M, P and C using one of the polar code construction methods described below. Alternatively, the polar code construction may determine the frozen bit positions since the information bit positions can be trivially derived from the frozen bit positions, and vice versa. The polar code constructor may update the code construction from time to time if the input parameters change.

An embodiment of the invention provides a method of constructing a (K, M, N, P, C) polar code from a sub-code and a reliability sequence for the sub-code. The method may be used for constructing a punctured polar code. This method can be used, for example, to determine the information bit positions for use in the system of FIG. 3A. Alternatively, the method can be implemented in the polar code constructor of FIG. 3B.

Designing a polar code involves finding the reliabilities of the sub-channels, sorting them, and choosing sub-channels (typically the most reliable ones) on which to transmit information bits. For a polar code of length N, this involves sorting a vector of real values of length N. To avoid sorting of large sequences, it is desirable to design a mother polar code from a sub-code that corresponds to a relatively short reliability sequence. For example, it is desirable to be able to design a polar code of length N=1024 by only sorting a vector of length 64 or shorter.

As a consequence of this desire to sort shorter lengths of code, a polar code decomposition method may be used to determine a polar code based on at least two polar codes of length $$\frac{N}{2}.$$

Advantageously, the sorting process to identify information bit positions may be done over a vector of real values of length $$\frac{N}{2}.$$

In addition, as described below, the method can be performed multiple times in sequence such that sorting need only be performed over a vector of real values of length $N/2^L$, where L is the number of times the method is performed. For example, if N=1024, performing the method once reduces the construction problem to that of designing a code with length 512, performing the method twice reduces the construction problem to that of designing a code of length 256. Performing the method four times reduces the construction problem to that of designing a code of length 64. In this last example, the sorting process need only be performed over a vector of length 64.

Figures 4, 5:
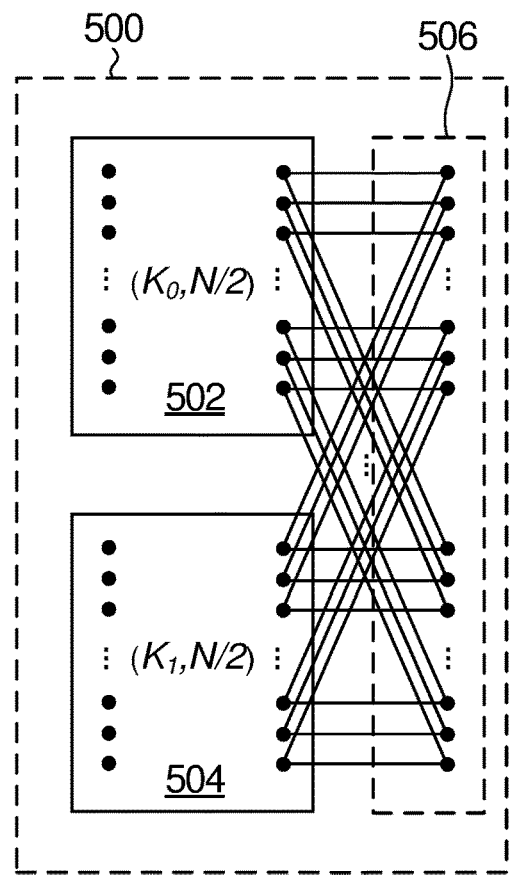
FIG. 4 depicts a (K, N) polar code in terms of two polar codes of length $$\frac{N}{2};$$
FIG. 5 depicts two graphical representations of the polarization kernel F.

Therefore, every polar code of length N can be described as combination of two polar codes of length N/2 by two types of channel polarization operators. FIG. 4 shows a pictorial explanation of this. The overall encoder of length N is indicated at 500, and this can be represented by a first polar code encoder 502 of length N/2 and a second polar code encoder 504 of length N/2, and the further additions indicated at 506. Where the length N code encodes K information bits, the two shorter encoders 502,504 encode $K_0$ and $K_1$ bits respectively, where $K=K_0+K_1$.

Sorting each reduced-length vector (i.e., identifying the information bit positions in the reduced-length polar code vector) requires knowledge of a reliability sequence matching the length of the vector and knowledge of the number of information bits allocated to the given reduced-length vector (e.g., $K_0$ and $K_1$).

Embodiments of the present invention provide a method for calculating the number of information bits allocated to the given reduced-length vector (e.g., $K_0$ and $K_1$). In particular, this calculation comprises improvements to polar code decomposition methods that are used for determining punctured polar codes.

As previously discussed, the performance of a polar code may be sensitive to puncturing because of the polarization of the sub-channel reliabilities in the polar code. In the embodiments of the present invention, the calculation of the number of information bits allocated to a given reduced-length vector is based on a puncturing pattern of the mother polar code. Basing the information bit length calculation at least in part on the puncturing pattern improves the performance of polar codes designed according to polar code decomposition methods.

The basic theory of polar code decomposition is explained below. Polar encoding an input vector polarizes the physical channel W over which the encoded codeword is to be transmitted, thus transforming the channel W into two channels $W^-$ and $W^+$. Consider the polarization kernel $$F = \begin{bmatrix} 1 & 0 \\ 1 & 1 \end{bmatrix},$$

which is also the generator matrix of a polar code of length 2. The information bits $u_0$ and $u_1$ are encoded with F to get the code bits $c_0$ and $c_1$ as $$[C_0, c_1] = [u_0, u_1] F$$

which results in $C_0 = u_0 + u_1$, $c_1 = u_1$ or $u_0 = c_0 + c_1$ and $u_1 = c_1$. FIG. 5 shows two graphical representations of the encoding.

The code bits $c_0$ and $c_1$ are then transmitted over a channel W and $y_0$ and $y_1$ are received. The channel W is described by a transition probability $P_w(y|u)$. The log-likelihood ratio (LLR) of the channel input u is defined $$\text{as} = \log \frac{Pr(y|0)}{Pr(y|1)}.$$

So the LLR of $c_0$ is and the LLR of $c_1$ is $$\lambda_0 = \log \frac{Pr(y_0|0)}{Pr(y_0|1)}$$

and the LLR of $c_1$ is $$\lambda_1 = \log \frac{Pr(y_1|0)}{Pr(y_1|1)}.$$

To decode $u_0$ from $y_0$ and $y_1$, one can calculate the LLR of $u_0$ from the $y_0$ and $y_1$. We have $$\lambda_{u_0} = \log \frac{Pr(u_0 = 0 | y_0, y_1)}{Pr(u_0 = 1 | y_0, y_1)}.$$

It can be shown that $$\lambda_{u_0} = 2 \tanh^{-1}\left(\tanh \frac{\lambda_0}{2} \tanh \frac{\lambda_1}{2}\right).$$

Then if $\lambda_{u_0} > 0$, the decoded $u_0$, denoted as $\hat{u}_0$ is set to 0 otherwise it is set to 1.

Figure 6:
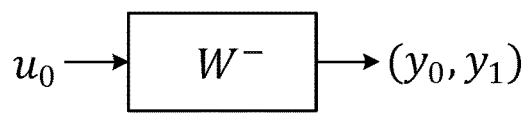
FIG. 6 is a block diagram of a transformed channel $W^-$.

The decoding of $u_0$ from $y_0$ and $y_1$ can be modelled by an equivalent channel $W^-$ with the input and output as depicted in FIG. 6.

The channel transition probability of $W^-$ is calculated from those of W as $$P_w^-(y_0, y_1 | u_0) = \frac{1}{2} \sum_{u_1=0,1} P_w(y_0 | u_0 + u_1) P_w(y_1 | u_1)$$

The channel $W^-$ can be proved to have less reliability than W (It is a worse channel than W). This channel is also referred to as XOR channel as $u_0$ is the XOR of $c_0$ and $c_1$ ($u_0 = c_0 + c_1$).

Once $u_0$ is decoded, we decode $u_1$ is decoded assuming that $u_0$ has been perfectly decoded, i.e. we know its true value is known.

To decode $u_1$ its LLR is calculated as $$\lambda_{u_1} = \log \frac{Pr(u_1 = 0 | y_0, y_1, u_0)}{Pr(u_1 = 1 | y_0, y_1, u_0)}.$$

It can be shown that $$\lambda_{u_1} = (1 - 2u_0)\lambda_0 + \lambda_1.$$

The decoded $u_1$, $\hat{u}_1$ is then *set* to 0 if $\lambda_{u_1} > 0$ and 1 otherwise.

Figure 7:
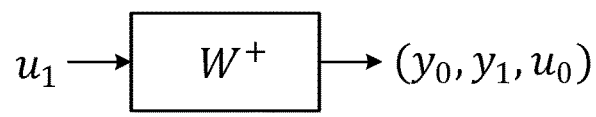
FIG. 7 is a block diagram of a transformed channel $W^+$.

The corresponding channel model for this decoding is $W^+$, as shown in FIG. 7, and has the following transition probability.

$$P_w^+(y_0, y_1, u_0 | u_1) = \tfrac{1}{2} P_w(y_0 | u_0 + u_1) P_w(y_1 | u_1).$$

It can be shown that $W^+$ is more reliable channel than W. Also since $u_0$ is known, we have $$u_1 = u_0 + c_0$$

$$u_1 = c_1.$$

So with perfect knowledge of $u_0$ one can think of the decoding of $u_1$ as if it was transmitted twice over the channel W. For this reason $W^+$ is sometimes referred to as the repetition channel.

Referring again to FIG. 4, the bits inputted to the upper polar code 502 are transmitted over the channel $W^-$ and the bits inputted to the lower polar code 504 are transmitted over the channel $W^+$. By calculating $K_0$ and $K_1$, one can then determine the upper code for $W^-$ and the lower code for $W^+$ by choosing $K_0$ information sub-channels for the upper code and $K_1$ information sub-channels for the lower code based on a given reliability sequence. As a consequence of determining the upper code for $W^-$ and the lower code for $W^+$, the overall (K, N) mother polar code will be determined. Typically, $K_0$ and $K_1$ are only chosen according to the capacity of the polarized channels $W^-$ and $W^+$.

Embodiments of the present invention, however, provide an improved method of polar code construction based on polar code decomposition. In particular, the embodiments of the present invention calculate $K_0$ and $K_1$, for example, based at least in part on a puncturing pattern of the mother polar code. The puncturing pattern can be arbitrary; therefore, embodiments of the present invention will also benefit from future superior puncturing patterns of polar codes.

To determine the parameters (K, M, N, P, C) of a polar code, a task is to find the set of information bit positions. In accordance with an embodiment of the invention, this is done by finding the respective sets of information bit positions for the upper and lower code of length N/2. A puncturing pattern P is applied to the code of length N, and accounting for the LLR calculation of the successive cancellation (SC) decoder, equivalently some of the code bits of the upper and lower codes of length N/2 will be punctured. More specifically, the upper code will have a puncturing pattern specified by a $$\frac{N}{2} \times 1$$

vector $P_0$ and the lower code will have a puncturing pattern specified by a $\frac{N}{2} \times 1$ vector $P_1$. A method is provided to convert the puncturing pattern P to the shorter puncturing patterns $P_0$ and $P_1$ of the smaller codes.

Initially, this will be described by way of example with reference to FIG. 8 which shows a length 8 polar code encoder 600 composed of two length 4 encoders 602,604, and further additions 606. Encoder 600 encodes input bits $u_0, u_1, \ldots, u_7$ (which include information bits and frozen bits, in positions to be determined) to produce encoded bits $c_0, c_1, \ldots, c_7$. Assuming a given puncturing pattern 620, these bits are punctured according to the puncturing pattern 620, and the remaining bits are transmitted over the channel 622. Channel 622 is indicated as W for non-punctured locations and X for punctured locations meaning the locations are not transmitted over the channel.

In the illustrated example, $$P = \begin{bmatrix} 1 \\ 0 \\ 0 \\ 1 \\ 1 \\ 0 \\ 1 \\ 0 \end{bmatrix}$$

is the puncturing pattern 620. This means that the code bits $c_1, c_2, c_5$ and $c_7$ are punctured.

The LLRs at the nodes of the upper code are calculated using check nodes. Based on these LLR calculations, it can be seen that the upper code sees a puncturing pattern $$P_0 = \begin{bmatrix} 1 \\ 0 \\ 0 \\ 0 \end{bmatrix}$$

624 and lower code sees a puncturing pattern $$P_1 = \begin{bmatrix} 1 \\ 0 \\ 1 \\ 1 \end{bmatrix}$$

626.

In general $P_0$ and $P_1$ can be calculated from P. Let $P^u$ be a $\frac{N}{2} \times 1$ vector containing the first $\frac{N}{2}$ rows of P and $P^l$ be a $\frac{N}{2} \times 1$ vector containing the second half of P. Then it can be shown that $$P_0 = P^u \otimes P^l$$

and $$P_1 = P^u \oplus P^l$$

where $\otimes$ and $\oplus$ are the Boolean multiplication and addition operators. Using this for the example of FIG. 8 results in $$P^u = \begin{bmatrix} 1 \\ 0 \\ 0 \\ 1 \end{bmatrix} \text{ and } P^l = \begin{bmatrix} 1 \\ 0 \\ 1 \\ 0 \end{bmatrix}$$

which gives $$P_0 = P^u \otimes P^l = \begin{bmatrix} 1 \\ 0 \\ 0 \\ 0 \end{bmatrix} \text{ and}$$

$$P_1 \text{ and } P^u \oplus P^l = \begin{bmatrix} 1 \\ 0 \\ 1 \\ 1 \end{bmatrix}.$$

Figure 8:
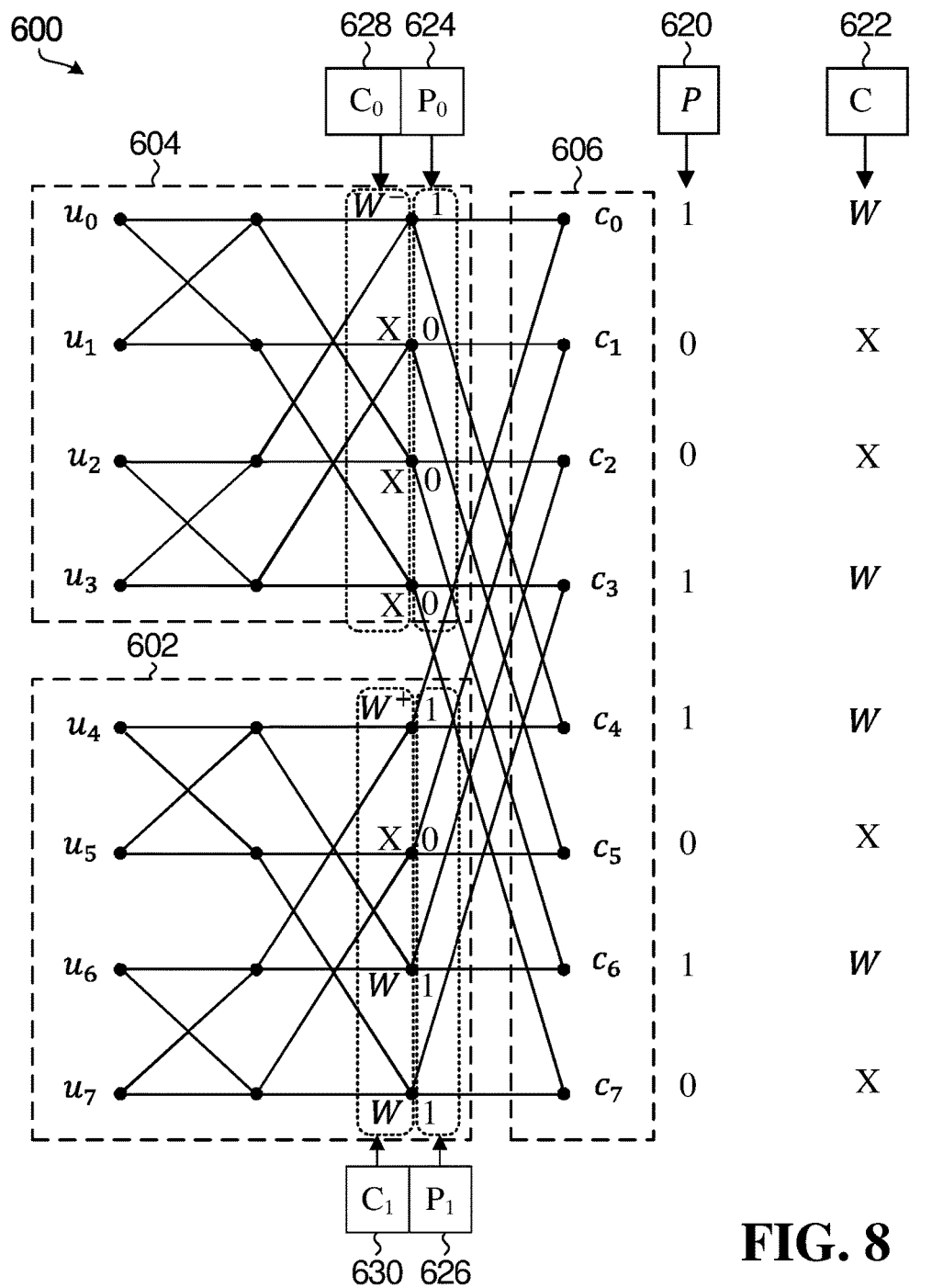
FIG. 8 shows how a puncturing sequence of an 8 bit polar code encoder can be converted to puncturing sequences for upper and lower 4 bit codes.

These puncturing patterns are shown in FIG. 8 at 624 and 626.

The next step is to determine what equivalent channels model each
upper and lower code. Let $$c^u = [c_0^u, c_1^u, \ldots, c_{\frac{N}{2}-1}^u] \text{ and } c^l = [c_0^l, c_1^l, \ldots, c_{\frac{N}{2}-1}^l]$$

be the codewords of the upper and lower codes. In the above example $c^u = [c_0^u, c_1^u, c_2^u, c_3^u]$ where $c_1^u, c_2^u$ and $c_3^u$ are punctured. Also $c_0^l = [c_1^l, c_2^l, c_2^l, c_3^l]$ where $c_1^l$ is punctured. In general a code bit $c_i^u$ of the upper code is unpunctured if and only if both $c_i$ and $$c_{i+\frac{N}{2}}$$

are unpunctured. Therefore every unpunctured code bit of the upper code is modelled by an equivalent channel $W^-$ as indicated at 628.

With the lower code, unpunctured code bits can be modelled by one of two different types as indicated at 630. $c_i^1$ is modelled by $W^+$ if both $c_i$ and $c_{i+N/2}$ are not punctured. If one of $c_i$ and $c_{1+N/2}$ is punctured, $c_i$ is modelled by the underlying channel W itself. The polarization transforms preserve the total capacity. Therefore, the total capacity available for the upper code plus that of the lower code is equal to the total capacity available for the code of length N.

Let $M_0$ and $M_1$ be the codeword length of the upper and lower codes. We have $M_0=\omega(P_0)$ and $M_1=\omega(P_1)$, where $\omega$ is the Hamming weight of the vector, i.e. the number of ones in it. Define channel capacities for the various channel types to be $C^-=I(W^-)$, $C^+=I(W^+)$ and $C=I(W)$. Due to capacity preservation referred to above, $C^-+C^+=2C$. The channel capacity for the unpunctured bits of the upper codes is $C_0=C^-$. The average channel capacity for the unpunctured code bits of the lower code is $$C_1 = \frac{1}{M_1}(MC - M_0 C_0)$$

Or $$C_1 = \frac{M_0}{M_1}C^+ + \frac{M-2M_0}{M_1}C.$$

Rate allocation involves determining how many of the K bits information bits of the overall code to transmit using the upper and lower codes respectively. The rate allocation to the upper and lower code can be performed as follows.

$$K_1 = M_1 C_1$$

$$K_0 = K - K_0.$$

Continuing the example of FIG. 8, consider the above puncturing pattern P and assume the channel capacity C=0.5. With K=3, M=4 and N=8. Accordingly, we have $M_0=1$, $M_1=3$, $C^+=0.74$ and $C^-=0.26$. So:

$$C_0 = C^- = 0.26,$$

$$C_1 = \frac{1}{3}(4 \times 0.5 - 1 \times 0.26) = 0.58.$$

$K_1 = 3 \times 0.58 = 1.74$ which can be rounded up to 2, and $K_0 = K - K_1 = 1$.

So the code design problem (3,4,8, $$\begin{bmatrix} 1 \\ 0 \\ 0 \\ 1 \\ 1 \\ 0 \\ 1 \\ 0 \end{bmatrix},$$

0.5) of reliability sequence length 8 is broken down to two code designs of length 4: (1,1,4, $$\begin{bmatrix} 1 \\ 0 \\ 0 \\ 0 \end{bmatrix},$$

0.26) and (2,3,4, $$\begin{bmatrix} 1 \\ 0 \\ 1 \\ 1 \end{bmatrix},$$

0.58).

The method shown by example in FIG. 8 may be performed by the polar code constructor of FIG. 3B. In this example, the polar code constructor need only store a reliability sequence of length 4, rather than of length 8. Furthermore, by basing the rate allocation calculations on the puncturing pattern P of the mother polar code, the polar code constructor in this example will construct polar codes having better performance than polar codes based on conventional construction methods.

The example presented above transforms the code design problem of length N to a code design problem of length $$\frac{N}{2}.$$

The design method is summarized as follows, where a Gaussian approximation to calculate $C^+$.

In the following example, a capacity C=K/M is specified, and a specific SNR is determined for a Binary-Input Additive White Gaussian Noise (BIAWGN) channel that yields this capacity. Equivalently, one could start with a specified SNR and compute the capacity C for the BIAWGN from that. More generally, the method described below is applicable to any specified capacity or SNR, a specified channel. Techniques for determining SNR from capacity or vice versa for many channel types are widely available.

Figure 9A:
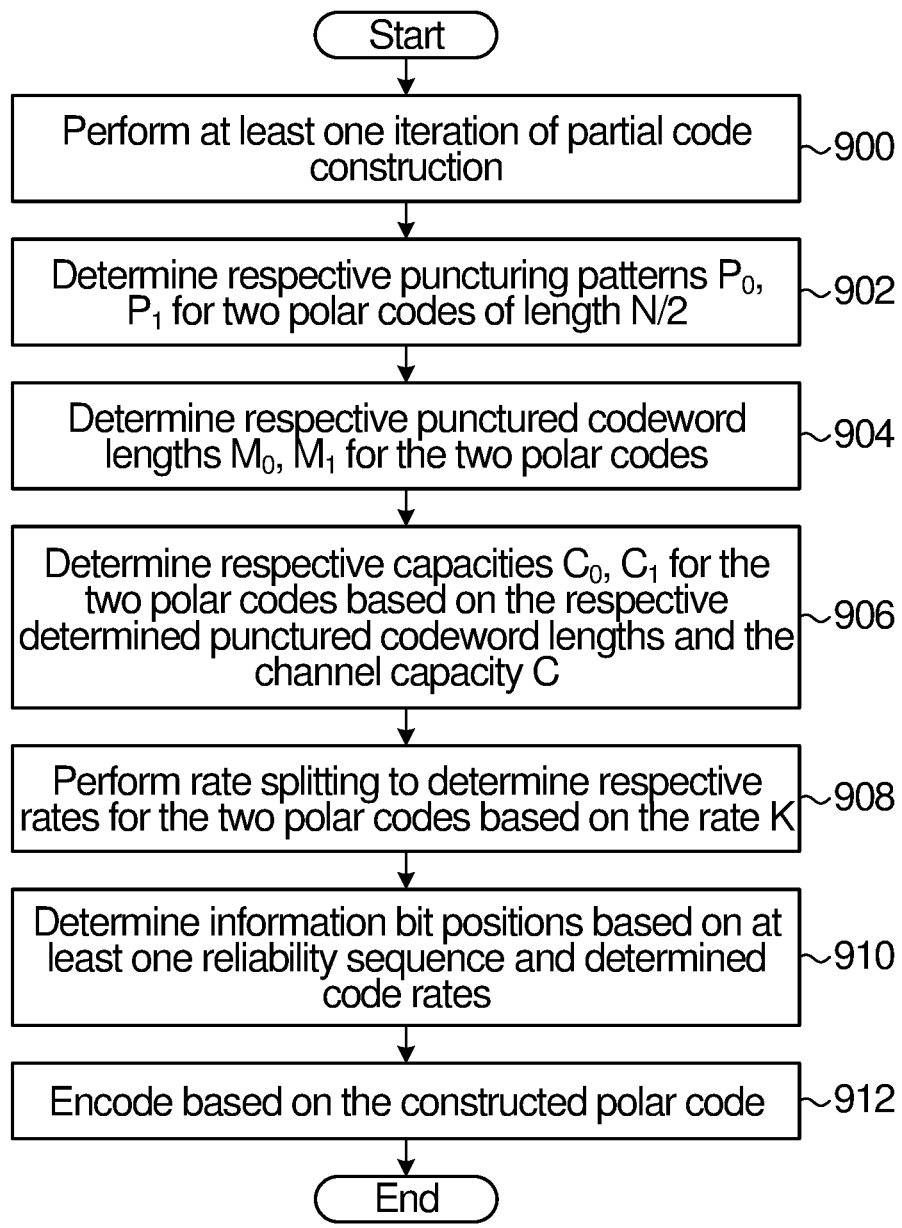
FIG. 9A is a flowchart of a method of constructing a polar code.

The method of polar code construction based on (K, M, N, P, C) will now be described with reference to FIG. 9A. An input to the method is a puncturing pattern P that will be used to puncture N−M bits and obtain a puncturing pattern P. For this example, $$C = \frac{K}{M},$$

but as noted above other values can be used.

The method involves performing at least one iteration of partial code construction in block 900. These iterations are referred to as "partial code construction" because the step of actually selecting the information bit positions is not performed for each iteration. Partial code construction may also be known as polar code decomposition. The first iteration involves performing code construction based on K, M, N, P, C defining the polar code to produce two polar codes of length N/2. Subsequent iterations, when necessary, performing two code constructions based on $$\left(K_0, M_0, \frac{N}{2}, P_0, C_0\right), \left(K_1, M_1, \frac{N}{2}, P_1, C_1\right)$$

produced in the previous iteration. The following steps are performed for each iteration.

Block 902 involves determining puncturing patterns for half length codes. Note that this step on its own is also referred to herein as puncturing pattern evolution. In a specific example, this is done according to:

$$P_0 = P\left(1:\frac{N}{2}\right) \otimes P\left(\frac{N}{2}+1:N\right)$$

$$P_1 = P(1:N/2) \oplus P\left(\frac{N}{2}+1:N\right).$$

Block 904 involves determining transmitted codeword lengths after puncturing for the two half length codes, where $\omega(.)$ is Hamming weight:

$$M_0 = \omega(P_0)$$

$$M_1 = M - M_0.$$

Block 906 involves determining the capacity $C_0$ and $C_1$ of the upper and lower codes based on the capacity C and the determined punctured codeword lengths. In a specific example, this involves first determining one or both of the capacity $C^+$ of the repetition channel and the capacity $C^-$ of the XOR channel. This is usually done using a capacity-transform function $C^+ = f(C)$.

In a specific example, the SNR for which the capacity of the BIAWGN channel is equal to C is determined, and this is used to determine $C^+$.

A simple implementation of $f(C)$ is via using the two functions $J(.)$ and $J^-(.)$ is $$SNR = J^{-1}(C)$$

$$SNR^+ = 2 \times SNR$$

$$C^+ = J(SNR^+).$$

where $J(SNR)$ is the capacity function of a binary AWGN channel. The above equations is in fact equivalent to one capacity transform $C^+ = f(C)$.
Then having determined $C^+$, the capacities of the upper and lower codes can be determined according to:

$$C_0 = 2C - C^+$$

$$C_1 = \frac{M_0}{M_1}C^+ + \frac{M - 2M_0}{M_1}C.$$

Block 908 involves performing rate splitting to determine rates of upper and lower codes:

$$K_0 = M_0 C_0$$

$$K_1 = K - K_0.$$

The entire partial code construction is repeated for two polar codes $$\left(K_0, M_0, \frac{N}{2}, P_0, C_0\right), \left(K_1, M_1, \frac{N}{2}, P_1, C_1\right)$$

and more generally, the partial code construction is repeated recursively until $$\frac{N}{2} = N_{ref}.$$

Where $N_{ref}$ is the smallest available sequence length. For example until N/2=64.

Block 910 involves determining information bit positions for the codes of length $N_{ref}$ using reliability sequence of length $N_{ref}$. Each of the codes of length of length $N_{ref}$ will be designed for a respective rate $K_i/N_{ref}$, i.e. $K_i$ information sub-channel. The information bits are transmitted in the $K_i$ most reliable positions as indicated by the reliability sequence. In some embodiments, the codes of length $N_{ref}$ are all the same, and as such, the information bit positions can be determined from a single common reliability sequence.

Given N and $N_{ref}$, there will be $$\frac{N}{N_{ref}}$$

codes of length $N_{ref}$. In the most general case, different reliability sequences of length $N_{ref}$ for each of these codes can be used to choose their information bit positions. However, in some cases, one common reliability sequence can be applied to all of these codes without any performance loss.

Optionally, the method includes block 912 which involves using the polar code thus constructed to encode a set of information bits. The mother polar code of length N is input with a vector of K information bits in positions specified by the $K_i$ bit positions for each shorter code. The output is punctured with puncturing pattern P and then transmitted over the channel.

As discussed above, the method is applied recursively until $$\frac{N}{2} = N_{ref},$$

$N_{ref}$ should be small, for example 64. At that point, the allocated number of information bits $K_i$, puncturing pattern $P_i$ and the code lengths $M_i$, $$i = 0, 1, \ldots, \frac{N}{N_{ref}} - 1$$

will have been determined for all the smaller codes of length $N_{ref}$. In some embodiments, a respective reliability sequence Q is used for each of the smaller codes of length $N_{ref}$. Note that $M_i = \omega(P_i)$. Since all the short codes are of length $N_{ref}$, the information bit locations of the i-th code can be determined using a reliability sequence $Q_{P_i}^{(i)}$ of length $N_{ref}$. Such a sequence is a function of the shorter code index i and its puncturing pattern $P_i$ of length $N_{ref}$.

In some embodiments, the reliability sequnce $Q_{P_i}^{(i)}$ is such that the $K_i$ information bits are chosen from amongst M information sub-channels that do not include disabled sub-channels.

In general, with puncturing a polar code of length N, if d code bits are punctured, the decoder inserts zero LLR for the punctured bits and performs decoding. Out of the N LLRs calculated for $u_0, u_1, \ldots, u_{N-1}$, precisely d of them will be zeros. This means that d code bits, are punctured there will be d sub-channels getting 0 LLRs. These d sub-channels are referred to as disabled sub-channels. They have zero-capacity. In some embodiments, no information is transmitted over these sub-channels, and instead these sub-channels are selected as frozen sub-channels.

The puncturing pattern evolution approach described above (the process of determining puncturing patterns for shorter and shorter codes) can be used to determine disabled sub-channels based on the puncturing patterns by continuing to iterate until $N_{ref}=1$. From the puncturing pattern P which contains d zeros, the puncturing patterns $P_0$ and $P_1$ of upper and lower codes are determined as described above. This is continued until the puncturing patterns are determined for small codes of length 1. The result will be N numbers. A zero means a disabled sub-channel, one means a not-disabled sub-channel. More specifically, after iterating the polar code decomposition down to a length of 1, there are N polar codes of length 1 each corresponding to a respective input bit position, and for each input bit position, if the puncturing pattern of the corresponding length 1 polar code is one, that bit position is an information bit position, and if the puncturing pattern of the corresponding length 1 polar code is zero, that bit is a frozen bit position.

Example: Consider puncturing N=8 in FIG. 8 with 4 punctured code bits 1, 2, 5 and 7. the puncturing pattern evolution on $P_0$ and $P_1$ is continued to get to the nodes in the first column ($N_{ref}=1$), the puncturing patterns for the 8 codes of length 1 as are determined as [0], [0], [0], [1], [0], [1], [1], [1]. This means that the sub-channels 0, 1, 2, and 4 become disabled. They are selected as frozen bit positions.

In general, the disabled sub-channels can be found using the puncturing pattern evolution process with $N_{ref}=1$. But there are some special types of puncturing patterns that make it simple to find the disabled sub-channels without having to perform puncturing pattern evolution. For example with BIV puncturing, if the code bits $i_1, i_2, \ldots, i_d$ are punctured, sub-channels $i_1, i_2, \ldots, i_d$ will become disabled. In an example where N=64, if code bits 0, 16, 32 are punctured according to BIV, then sub-channels with same indices 0, 16, and 32 became disabled.

In some embodiments, for the described punctured code construction or for shortened code construction detailed below, code construction is performed on the fly on an as needed basis. For example, the code construction may be performed based on one or more of:

SNR which may change over time;
Mother code rate K/M;
Puncturing pattern P which may be re-specified from time to time.

Block 910 referred to above refers to selecting information bit positions based on a reliability sequence. An initial step in code construction is to compute the reliabilities for all of the sub-channels of the codes of length $N_{ref}$. From these reliabilities, the highest reliability sub-channels are typically used for the information bits and any CRC bits, parity bits, or other "assistant" bits that are used to assist in decoding. For the purpose of this application, any available method of determining sub-channel reliabilities, and the reliability sequence, can be employed.

Figure 9B:
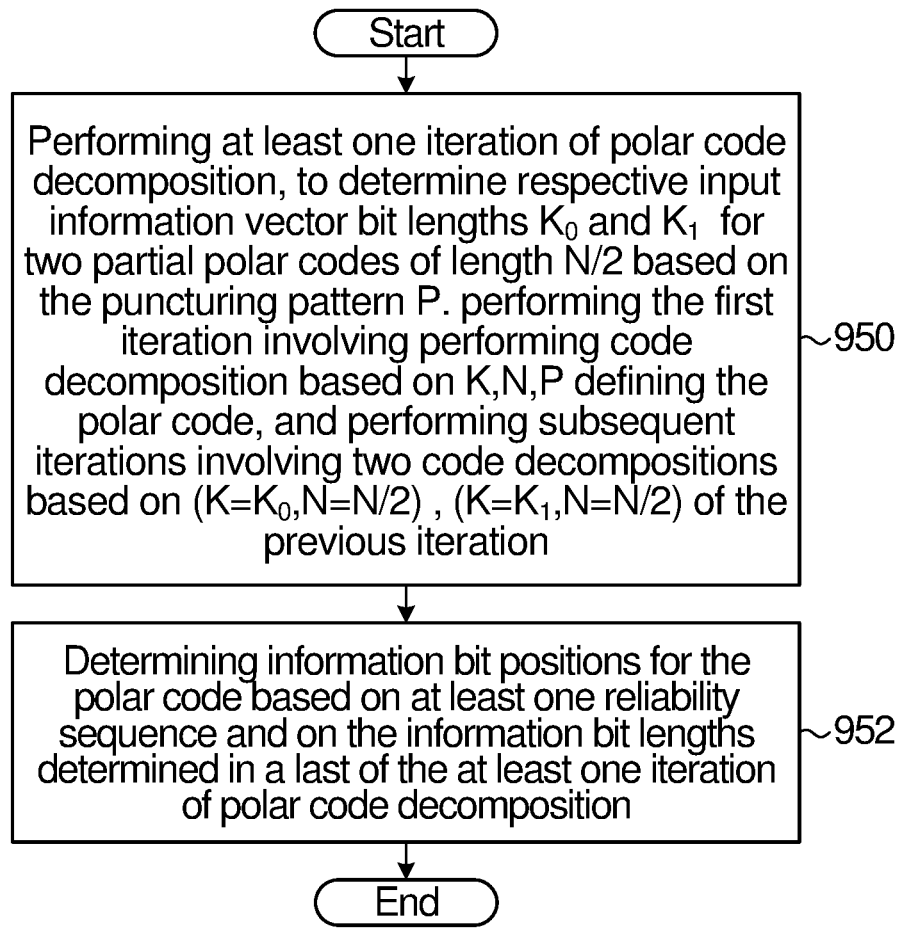
FIG. 9B is a flowchart of another method of constructing a polar code.

Another method of polar code construction based on (K, N, P) will now be described with reference to FIG. 9B. An input to the method is a puncturing pattern P that will be used to puncture bits and obtain a puncturing pattern P. The method begins at block 950 with performing at least one iteration of polar code decomposition. Performing the first iteration involves performing code decomposition based on K, N, P defining the polar code, and performing subsequent iterations involves two code decompositions based on $$\left(K = K_0, N = \frac{N}{2}\right), \left(K = K_1, N = \frac{N}{2}\right)$$

of the previous iteration. Performing polar code decomposition involves determining respective input information vector bit lengths $K_0$ and $K_1$ for two partial polar codes of length N/2 based on the puncturing pattern P. The method continues at 952 with determining information bit positions for the polar code based on at least one reliability sequence and on the information bit lengths determined in a last of the at least one iteration of polar code decomposition.

Optionally, the polar code is further defined by M, C, where M is an output codeword bit length after puncturing using the puncturing pattern P, and C is a channel capacity, and the method further involves performing code decomposition based on K, M, N, P, C defining the polar code, and performing subsequent iterations comprising two code decompositions based on $$\left(K = K_0, M = M_0, N = \frac{N}{2}, P = P_0, C = C_0\right),$$
$$\left(K = K_1, M = M_1, N = \frac{N}{2}, P = P_1, C = C_1\right)$$

of the previous iteration. Optionally, the method further includes:

determining respective puncturing patterns $P_0$, $P_1$ for the two polar codes of length N/2 based on the puncturing pattern P;

determining respective punctured codeword lengths $M_0$, $M_1$ for the two polar codes based on the puncturing patterns; and determining respective capacities $C_0$, $C_1$ for the two polar codes based on the respective determined punctured codeword lengths and the channel capacity C.

determining the respective input information vector bit lengths $K_0$ and $K_1$ is based on at least one of the determined punctured codeword lengths $M_0$, $M_1$ and at least one of the determined capacities $C_0$, $C_1$.

There are several methods to compute sub-channel reliabilities, but these methods may lead to different results. For example, according to a genie-aided method proposed in R. Pedarsani, "Polar Codes: Construction and Performance Analysis", June 2011, EPFL master project, an encoder encodes a training sequence that is known to the decoder on different sub-channels. The decoder feeds back decoding results to the encoder so that the encoder can compute reliability statistics for every sub-channel, and a well-adapted reliability-vector over the sub-channels is obtained. The training procedure takes place with a given SNR, and therefore this method is SNR-related and not in real time.

A Gaussian-approximation method proposed in [4] J. Dai, K. Niu, Z. Si, J. Lin, "Evaluation and Optimization of Gaussian Approximation for Polar Codes", May 2016, assumes that every coded bit is subjected to an equal error probability. From the error probability, the reliabilities over the sub-channels are obtained with a density evolution algorithm.

In mobile wireless communications, the radio channel is time-varying. It is impractical to consume significant communication bandwidth and processing resources for a genie-aided construction method. Gaussian-approximation may therefore be preferred, in conjunction with fixing a working SNR or reference SNR for a particular combination of code length and code rate.

However, Gaussian-approximation-based methods for computing reliabilities over the sub-channels are also highly complex. With shorter and shorter decoding latency requirements in some applications, it can be difficult to implement hardware for practical on-the-fly reliability computations. Storing all reliability vectors for all possible values of N and working SNRs would consume more memory than would be practical in a mobile wireless system, for example, and therefore in such an application it is necessary to re-compute sub-channel reliabilities whenever the mother code length N is changed.

Gaussian-approximation-based methods also require an SNR input. Different SNR inputs result in different reliability vectors. In order to align both an encoder and a decoder, a working SNR must be provided to both the encoder and the decoder. Also, any offset between a working SNR value that is used by the encoder and decoder and a real channel SNR at the decoder leads to performance loss.

Shortening

The embodiments described above have employed the use of puncturing. With puncturing, certain bits of the output are not transmitted, and the bits are specified by the puncturing pattern. In the most general case, no specific limitations are placed on the puncturing pattern, and there is no relationship between frozen bit locations and the puncturing pattern.

Further embodiments relate to the use of rate matching technique known as "shortening" which involves the use of shortening patterns. A shortening pattern is a special case of a puncturing pattern. Like any puncturing pattern, a shortening pattern indicates which encoded bits are not transmitted. The bits that are not transmitted are also referred to as "shortened" bits. With shortening, frozen bit locations are specifically selected, as a function of the shortening pattern, such that the shortened bits are always zero. Because they are always zero, they are known to the receiver, and do not need to be transmitted. In contrast, in the more general puncturing case, the punctured bits are typically not known to the receiver.

Similar to the embodiments described for the puncturing case, polar code decomposition is used for the shortening case. To calculate the shortening pattern seen by the upper and lower code we examine one butterfly, again with reference to FIG. 5.

Consider the four different possibilities of the shortening at the two code bits $c_0$ and $c_1$. If both $c_0$ and $c_1$ are shortened. They take deterministic 0-value so both $u_0$ and $u_1$ are shortened. If neither of $c_0$ and $c_1$ are shortened, none of $u_0$ and $u_1$ are shortened. If only $c_1$ is shortened, only $u_1$ will be shortened and if only $c_0$ is shortened, all that can be said is that $u_0=u_1$, so neither of $u_0$ and $u_1$ are shortened. In summary $u_0$ is shortened if both $c_0$ and $c_1$ are shortened, and $u_1$ is shortened if $c_1$ is shortened. The shortening indicator at $u_0$ is a logical OR of those of $c_0$ and $c_1$, and the indicator at $u_1$ is that of $c_1$. The shortening pattern in this butterfly can be used to find the shortening pattern of the two upper and lower codes of a given polar code.

Figure 10A:
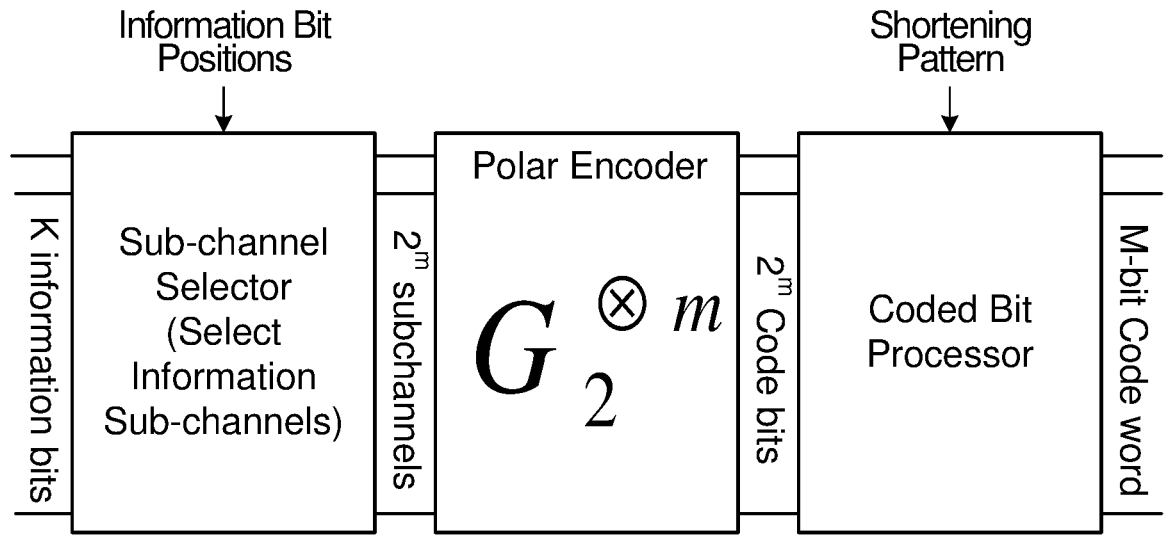
FIG. 10A is a block diagram illustrating an example of a rate-matching polar encoder based on 2-by-2 kernel, which includes a sub-channel selector, a polar encoder and coded-bit processor.

FIG. 10A is a block diagram illustrating an example of a rate-matching polar encoder provided by an embodiment of the invention, which includes a sub-channel selector, a polar encoder and a coded-bit processor, where shortening is used in the transmitter. The example in FIG. 10A is based on a 2-by-2 kernel, K information bits, M-bit codeword, and R=K/M code rate that is achieved by shortening by the coded bit processor using shortening pattern S in the coded bit processor. An input to the sub-channel selector is a set of information bit positions determined using one of the polar code constructions methods described below. Alternatively, the frozen bit positions may be determined and input to the sub-channel selector since the information bit positions can be trivially derived from the frozen bit positions, and vice versa. An input to the coded bit processor is the shortening pattern S.

Figure 10B:
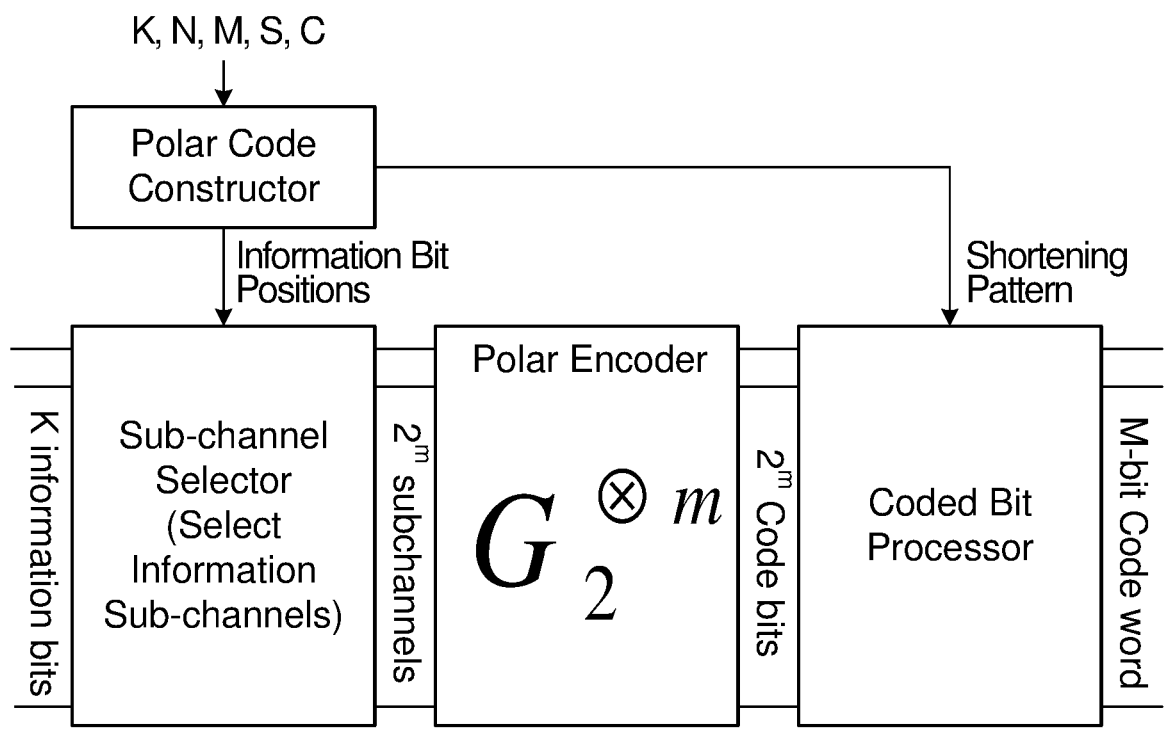
FIG. 10B is a block diagram illustrating an example of a rate-matching polar encoder similar to that of FIG. 10A, also including a polar code constructor.

FIG. 10B is a block diagram illustrating an example of a rate-matching polar encoder provided by another embodiment of the invention. This example is similar to that of FIG. 10A, but also includes a polar code constructor which determines the information bit positions based on input parameters that include one or more of K, N, M, S and C using one of the polar code construction methods described below. Alternatively, the polar code construction may determine the frozen bit positions since the information bit positions can be trivially derived from the frozen bit positions, and vice versa. The polar code constructor may update the code construction from time to time if the input parameters change.

An embodiment of the invention provides a method of constructing a (K, M, N, S, C) polar code from a sub-code and a reliability sequence for the sub-code. The method may be used for constructing a shortened polar code. This method can be used, for example, to determine the information bit positions for use in the system of FIG. 10A. Alternatively, the method can be implemented in the polar code constructor of FIG. 10B.

As for the punctured polar code embodiments described above, for shortened polar code construction, a polar code decomposition method may be used to determine a polar code based on at least two polar codes of length N/2. Advantageously, the sorting process to identify information bit positions may be done over a vector of real values of length N/2. In addition, as described below, the method can be performed multiple times in sequence such that sorting need only be performed over a vector of real values of length $N/2^L$, where L is the number of times the method is performed. For example, if N=1024, performing the method once reduces the construction problem to that of designing a code with length 512, performing the method twice reduces the construction problem to that of designing a code of length 256. Performing the method four times reduces the construction problem to that of designing a code of length 64. In this last example, the sorting process need only be performed over a vector of length 64.

Recall that every polar code of length N can be described as combination of two polar codes of length N/2 by two types of channel polarization operators. FIG. 4 shows a pictorial explanation of this.

Embodiments of the present invention provide a method for calculating the number of information bits allocated to the given reduced-length vector (e.g., $K_0$ and $K_1$). In particular, this calculation comprises improvements to polar code decomposition methods that are used for determining shortened polar codes.

The performance of a polar code may be sensitive to shortening because of the polarization of the sub-channel reliabilities in the polar code. In the embodiments of the present invention, the calculation of the number of information bits allocated to a given reduced-length vector is based on a shortening pattern of the mother polar code. Basing the information bit length calculation at least in part on the shortening pattern improves the performance of polar codes designed according to polar code decomposition methods.

To determine the parameters (K, M, N, S, C) of a polar code, a task is to find the set of information bit positions. In accordance with an embodiment of the invention, this is done by finding the respective sets of information bit positions for the upper and lower code of length N/2. A shortening pattern P is applied to the code of length N, and accounting for the LLR calculation of the successive cancellation (SC) decoder, equivalently some of the code bits of the upper and lower codes of length N/2 will be shortened. More specifically, the upper code will have a shortening pattern specified by a $$\frac{N}{2} \times 1$$

vector $S_0$ and the lower code will have a shortening pattern specified by a $$\frac{N}{2} \times 1$$

vector $S_1$. A method is provided to convert the shortening pattern S to the shorter puncturing patterns $S_0$ and $S_1$ of the smaller codes.

Initially, this will be described by way of example with reference to FIG. 11 which shows a length 8 polar code encoder 1100 composed of two length 4 encoders 1102, 1104, and further additions 1106. Encoder 1100 encodes input bits $u_0, u_1, \ldots, u_7$ (which include information bits and frozen bits, in positions to be determined) to produce encoded bits $c_0, c_1, \ldots, c_7$. Assuming a given shortening pattern 1120, these bits are shortened according to the puncturing pattern 1120, and the remaining bits are transmitted over the channel 1122. Channel 1122 is indicated as W for non-shortened locations and X for shortened locations meaning the locations are not transmitted over the channel.

In the illustrated example, $$S = \begin{bmatrix} 1 \\ 1 \\ 1 \\ 0 \\ 1 \\ 0 \\ 0 \\ 0 \end{bmatrix}$$

is the shortening pattern 1120. This means that the code bits $c_3, c_5, c_6$ and $c_7$ are shortened.

The LLRs at the nodes of the upper code are calculated using check nodes. Based on these LLR calculations, it can be seen that the upper code sees a shortening pattern $$S_0 = \begin{bmatrix} 1 \\ 1 \\ 1 \\ 0 \end{bmatrix}$$

1124 and lower code sees a shortening pattern $$S_1 = \begin{bmatrix} 1 \\ 0 \\ 0 \\ 0 \end{bmatrix}$$

1126.

In general $S_0$ and $S_1$ can be calculated from S. Let $S^u$ be a N/2×1 vector containing the first $$\frac{N}{2}$$

rows of S and $S^l$ be a $$\frac{N}{2} \times 1$$

vector containing the second half of S. Then it can be shown that $$P_0 = S^u \oplus S^l$$

and $$S_1 = S^l.$$

where $\oplus$ is the Boolean addition operator. Using this for the example of FIG. 11 results in $$S^u = \begin{bmatrix} 1 \\ 1 \\ 1 \\ 0 \end{bmatrix} \text{ and } S^l = \begin{bmatrix} 1 \\ 0 \\ 0 \\ 0 \end{bmatrix}$$

which gives $$S_0 = S^u \oplus S^l = \begin{bmatrix} 1 \\ 1 \\ 1 \\ 0 \end{bmatrix} \text{ and } S_1 = S^l = \begin{bmatrix} 1 \\ 0 \\ 0 \\ 0 \end{bmatrix}.$$

Figure 11:
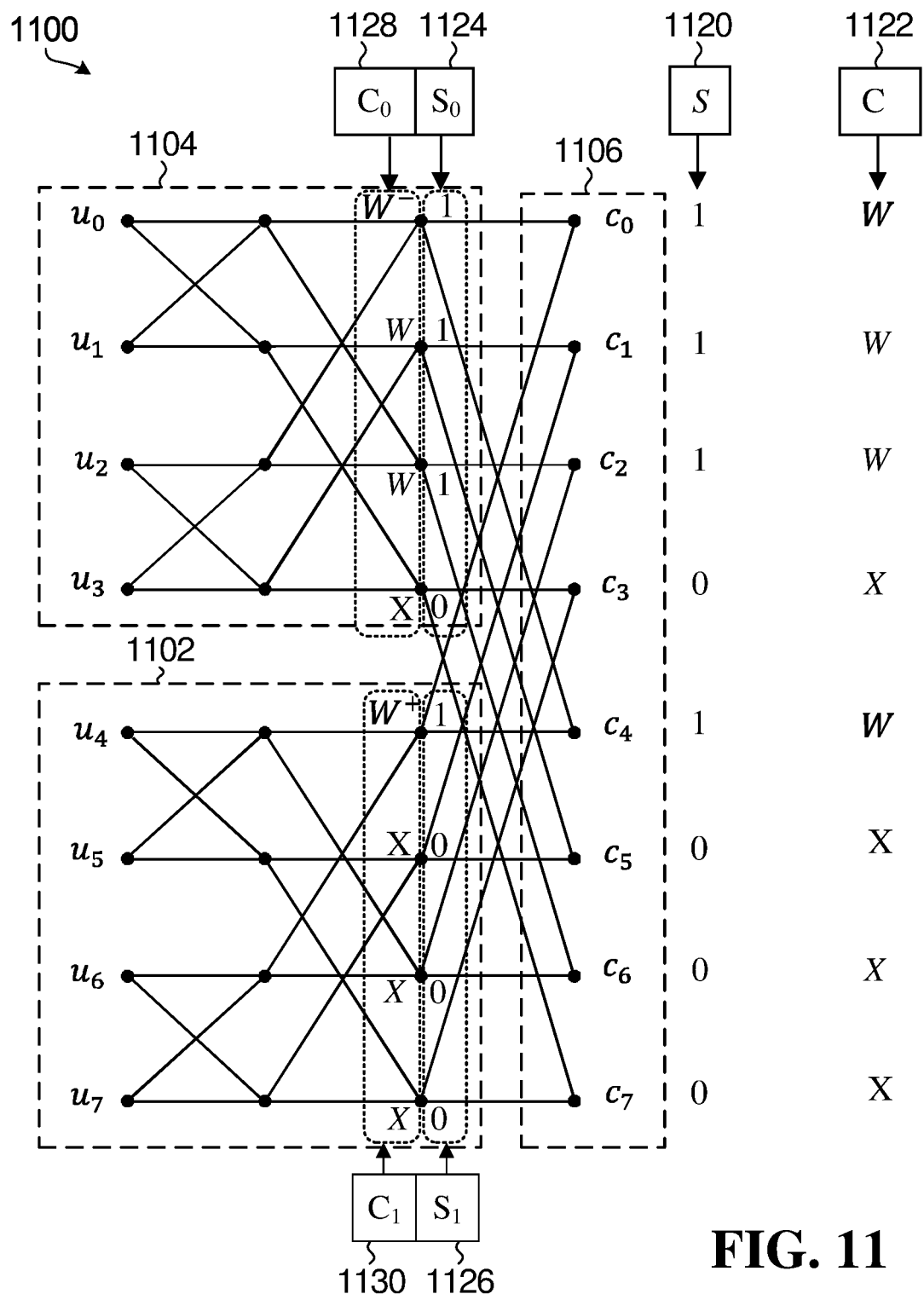
FIG. 11 shows how a shortening sequence of an 8 bit polar code encoder can be converted to shortening sequences for upper and lower 4 bit codes.

These shortening patterns are shown in FIG. 11 at 1124 and 1126.

Regarding the evolution of the channel capacities, all the unshortened nodes of the lower code see channel $W^+$ as indicated at 1130, while the unshortened nodes of the upper codes can see either $W^-$ or the original channel W itself as indicated at 1128. For example consider the butterfly containing $c_1$ and $c_5$. Since the LLR coming from $c_5$ is plus infinity, the LLR calculated at the top left node is the one coming from $c_1$, so the equivalent channel seen by it is W not $W^-$. This is used to modify the rate allocation of the puncturing case to produce rate allocation for the shortening case.

The example presented above transforms the code design problem of length N to a code design problem of length $$\frac{N}{2}.$$

The design method is summarized as follows, where a Gaussian approximation to calculate C+.

In the following example, a capacity C=K/M is specified, and a specific SNR is determined for a Binary-Input Additive White Gaussian Noise (BIAWGN) channel that yields this capacity. Equivalently, one could start with a specified SNR and compute the capacity C for the BIAWGN from that. More generally, the method described below is applicable to any specified capacity or SNR, for and for a specified channel. Techniques for determining SNR from capacity or vice versa for many channel types are widely available.

Figure 12A:
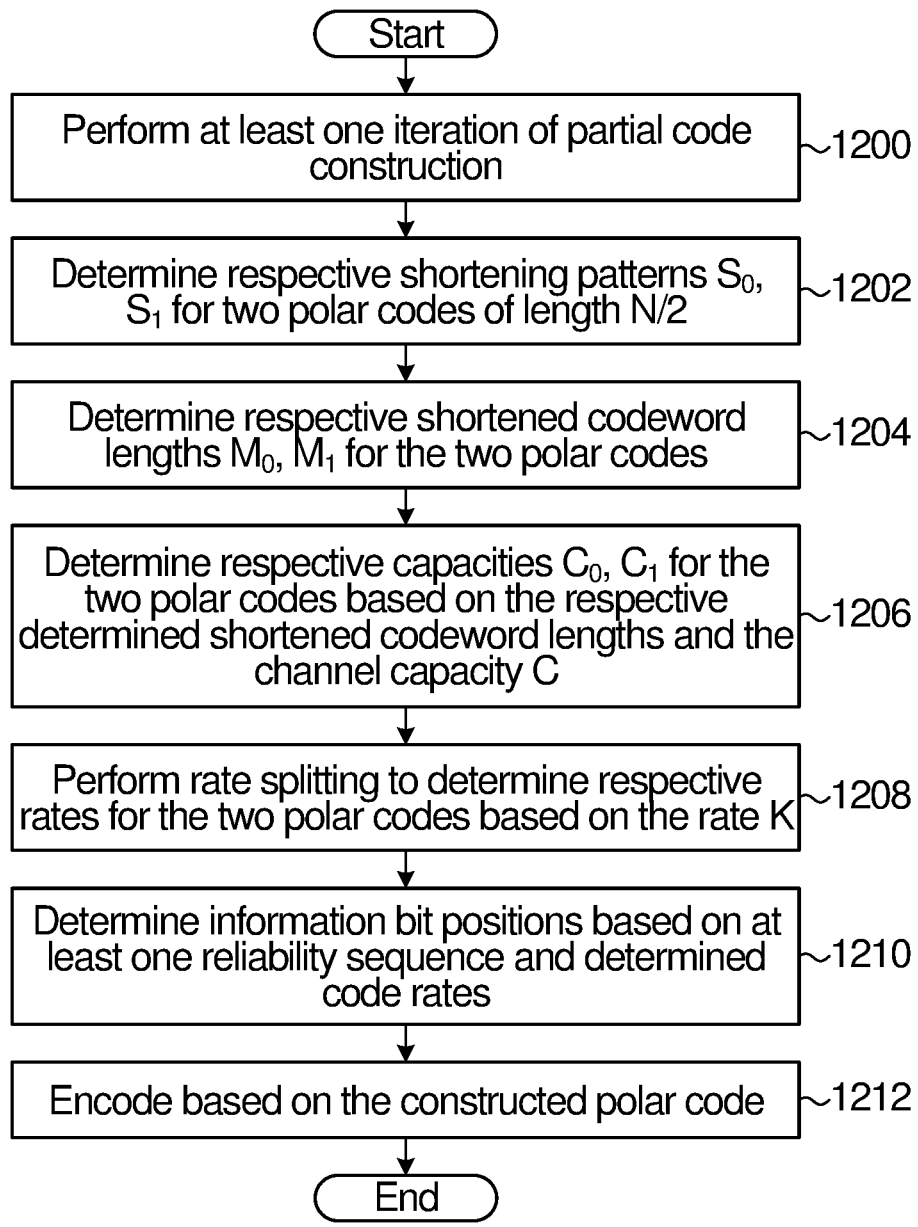
FIG. 12A is a flowchart of a method of constructing a polar code.

The method of polar code construction based on (K, M, N, S, C) will now be described with reference to FIG. 12A. An input to the method is a puncturing pattern S that will be used to shorten N−M bits.

The method involves performing at least one iteration of partial code construction in block 1200. These iterations are referred to as "partial code construction" because the step of actually selecting the information bit positions is not performed for each iteration. Partial code construction may also be known as polar code decomposition. The first iteration involves performing code construction based on K, M, N, S, C defining the polar code to produce two polar codes of length N/2. Subsequent iterations, when necessary, involve performing two code constructions based on $$\left(K_0, M_0, \frac{N}{2}, S_0, C_0\right), \left(K_1, M_1, \frac{N}{2}, S_1, C_1\right)$$

produced in the previous iteration. The following steps are performed for each iteration.

Block 1202 involves determining shortening patterns for half length codes. In a specific example, this is done according to:

$$S_0 = S(1:N/2) \oplus S(N/2+1:N)$$

$$S_1 = S\left(\frac{N}{2}+1:N\right).$$

Block 1204 involves determining transmitted codeword lengths after puncturing for the two half length codes, where w(.) is Hamming weight:

$$M_0 = \omega(S_0)$$

$$M_1 = M - M_0.$$

Block 1206 involves determining the capacity $C_0$ and $C_1$ of the upper and lower codes based on the capacity C and the determined shortened codeword lengths. The capacities are different than for punctured codes, and can be expressed as:

$$C_0 = \frac{M}{M_0}C - \frac{M_1}{M_0}C^+$$
$$C_1 = C^+.$$

$C^+$ can be found from C using a capacity-transform function $C^+ = f(C)$ using either the AWGN channel capacity function or polynomials just as in the puncturing case described previously.

Block 1208 involves performing rate splitting to determine rates of upper and lower codes:

$$K_1 = M_1 C_1$$

$$K_0 = K - K_1.$$

The entire partial code construction is repeated for two polar codes $$\left(K_0 M_0, \frac{N}{2}, S_0, C_0\right), \left(K_1, M_1, \frac{N}{2}, S_1, C_1\right).$$

and more generally, the partial code construction is repeated recursively until $$\frac{N}{2} = N_{ref},$$

where $N_{ref}$ is the smallest available sequence length. For example until N/2=64.

Block 1210 involves determining information bit positions for the codes of length $N_{ref}$ using one or more reliability sequences of length $N_{ref}$. Each of the codes of length of length $N_{ref}$ will be designed for a respective rate $K_i/N_{ref}$, i.e. $K_i$ information sub-channel. The information bits are transmitted in the $K_i$ most reliable positions as indicated by the reliability sequence. In some embodiments, the codes of length $N_{ref}$ are all the same, and as such, the information bit positions can be determined from a single common reliability sequence.

As described above for the more general puncturing case, disabled sub-channels can be determined by continuing shortening pattern evolution until $N_{ref}$. In general, with a shortened polar code, if d code bits are shortened, the decoder inserts infinity LLR for the shortened code bits (recall that this was because the shortened code bits have deterministic 0 values. LLR is defined as $$\log\frac{Pr(0)}{Pr(1)} = \log\frac{1}{0} = +\infty.$$

In practice the decoder uses a large number instead of +∞) and performs decoding. Out of the N LLRs calculated for $u_0$, $u_1, \ldots, u_{N-1}$, precisely d of them will become +∞. A +∞ LLR for $u_i$ means it is 0 with full certainty, i.e. zero error decision probability. In other words, $u_i$ is recovered perfectly with zero error probability. So if d code bits are shortened, there will be d sub-channels with +∞ LLRs. These d sub-channels are referred to as recovered sub-channels. A recovered sub-channel (i.e., a sub-channel subjected to shortening) should be always frozen. In other words, the d shortened code bits became shortened only because d carefully chosen sub-channel had become frozen.

Similar to the puncturing case the above method is applied recursively until $$\frac{N}{2} = N_{ref}.$$

$N_{ref}$ should be small, for example 64. After iterating, the allocated number of information bits $K_i$, shortening pattern $S_i$ and the code lengths $$M_i, i = 0, 1, \ldots, \frac{N}{N_{ref}} - 1$$

will be available for all the smaller codes of length $N_{ref}$. Note that $M_i = \omega(S_i)$. Since all the short codes are of length $N_{ref}$, the information bit locations of the i-th code can be determined using a reliability sequnce $Q_{P_i}^{(i)}$ of length $N_{ref}$. Such a sequence is a function of the shorter code index i and its shortening pattern $S_i$ of length $N_{ref}$. The sequnce $Q_{P_i}^{(i)}$ should be such that the $K_i$ information bit are chosen by skipping the shortened information bits.

In some embodiments, the shortened information bits can be found by recurisve applications of partial code construction down to the short code length of 1 ($N_{ref}=1$). A zero-valued shortening pattern indicates a shortened information bit.

Unlike the case for embodiments involving puncturing, the code construction for shortening is valid for shortening schemes meeting one requirement: If only one of the two right nodes of a butterfly is shortened, it is the right lower node. This holds for all of BIV (bit reversal), polarization weight (PW), natural, and block shortening methods.

Optionally, the method includes block 1212 which involves using the polar code thus constructed to encode a set of information bits. The mother polar code of length N is input with a vector of K information bits in positions specified by the $K_i$ bit positions for each shorter code. The output is shortened with shortening pattern S and then transmitted over the channel.

Figure 12B:
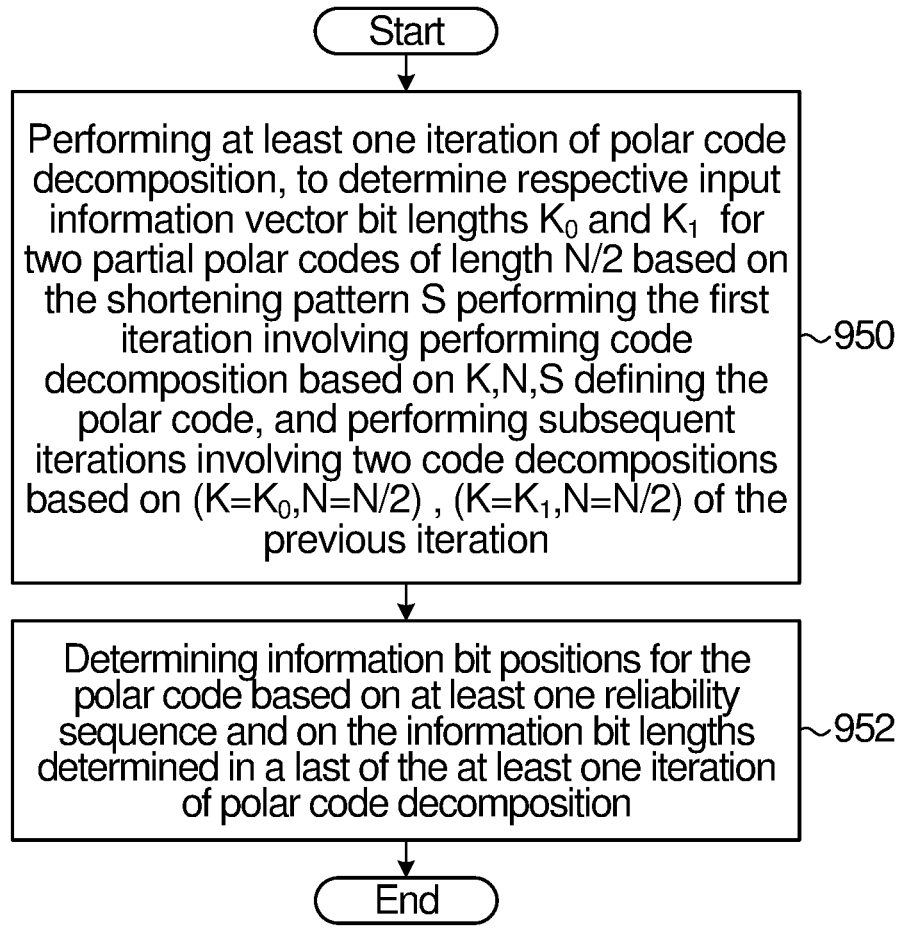
FIG. 12B is a flowchart of another method of constructing a polar code.

Another method of polar code construction based on (K, N, P) will now be described with reference to FIG. 12B. An input to the method is a shortening pattern S that will be used to puncture bits and obtain a shortening pattern S. The method begins at block 1250 with performing at least one iteration of polar code decomposition. Performing the first iteration involves performing code decomposition based on K, N, P defining the polar code, and performing subsequent iterations involves two code decompositions based on $$\left(K = K_0, N = \frac{N}{2}\right), \left(K = K_1, N = \frac{N}{2}\right)$$

of the previous iteration. Performing polar code decomposition involves determining respective input information vector bit lengths $K_0$ and $K_1$ for two partial polar codes of length N/2 based on the shortening pattern S. The method continues at 952 with determining information bit positions for the polar code based on at least one reliability sequence and on the information bit lengths determined in a last of the at least one iteration of polar code decomposition.

M, C, where M is an output codeword bit length after puncturing using the puncturing pattern S, and C is a channel capacity, and the method further involves performing code decomposition based on K, M, N, S, C defining the polar code, and performing subsequent iterations comprising two code decompositions based on $$\left(K = K_0, M = M_0, N = \frac{N}{2}, S = S_0, C = C_0\right),$$

$$\left(K = K_1, M = M_1, N = \frac{N}{2}, S, S_1, C = C_1\right)$$

of the previous iteration. Optionally, the method further includes:

determining respective shortening patterns $S_0$, $S_1$ for the two polar codes of length N/2 based on the shortening pattern S;

determining respective shortening codeword lengths $M_0$, $M_1$ for the two polar codes based on the shortened patterns; and determining respective capacities $C_0$, $C_1$ for the two polar codes based on the respective determined shortened codeword lengths and the channel capacity C.

determining the respective input information vector bit lengths $K_0$ and $K_1$ is based on at least one of the determined shortened codeword lengths $M_0$, $M_1$ and at least one of the determined capacities $C_0$, $C_1$.

Low-Complexity Implementation

Further embodiments provide low-complexity implementations of the above-described methods. In particular, these embodiments focus on avoiding the division operator in the steps of determining capacities for the shorter codes, and also provide simple approximations of the capacity-transform function $f$.

It is desired to avoid the division operator in this step to mitigate code construction complexity.

BIV Puncturing or Shortening

A first example will be described that is suitable to BIV puncturing or shortening. With BIV puncturing/shortening the bits are punctured/shortened according to the bit-reversal permutation. This results in a BIV puncturing/shortening for the two smaller codes.

For BIV puncturing $M_0$ and $M_1$ can be calculated as $$M_0 = \lfloor M/2 \rfloor, M_1 = \lceil M/2 \rceil$$

where $\lfloor\ \rfloor$ is a floor function and $\lceil\ \rceil$ is a ceiling function.

In this case, the step of determining the short code capacities becomes $$C_1 = \begin{cases} C^+ & M \text{ even} \\ \cong C^+ & M \text{ odd} \end{cases}.$$

For BIV shortening $M_0$ and $M_1$ can be calculated as $$M_0 = \lceil M/2 \rceil, M_1 = \lfloor M/2 \rfloor$$

and $$C_0 = \begin{cases} 2C - C^+ & M \text{ even} \\ \cong 2C - C^+ & M \text{ odd} \end{cases}.$$

It can be seen that the division can be avoided for both puncturing and shortening.

Natural (NAT) Puncturing or Shortening

A second example will be described that is suitable for NAT puncturing or shortening. With NAT puncturing the punctured code bits are chosen from the beginning of the codeword. This will imply a NAT puncturing/shortening for the two smaller codes.

For NAT puncturing, $M_0$ and $M_1$ can be calculated as $$M_0 = \max\left(0, M - \frac{N}{2}\right)$$

$$M_1 = \min\left(M, \frac{N}{2}\right).$$

So $$\frac{M_0}{M_1}$$

becomes $$\frac{M_0}{M_1} = \begin{cases} 0, & \text{if } M \leq \frac{N}{2} \\ \frac{2M}{N} - 1, & \text{if } M > N/2 \end{cases}.$$

So $$C_1 = \begin{cases} C, & \text{if } M \leq \frac{N}{2} \\ \frac{M}{2^{n-1}}(C^+ - C) - C^+, & \text{if } M > N/2 \end{cases}.$$

It can be seen that the division complexity in the calculation of $C_1$ can be reduced to either no division or dividing an integer (M) by a power-of-2 integer $2^{n-1}$, which can be easily implemented in hardware.

For NAT shortening $M_0$ and $M_1$ can be calculated as $$M_0 = \min\left(M, \frac{N}{2}\right)$$

$$M_1 = \max\left(0, M - \frac{N}{2}\right).$$

So $$\frac{M_1}{M_0}$$

becomes $$\frac{M_1}{M_0} = \begin{cases} 0, & \text{if } M \leq \frac{N}{2} \\ \frac{2M}{N} - 1, & \text{if } M > N/2 \end{cases}.$$

So $$C_1 = \begin{cases} C, & \text{if } M \leq \frac{N}{2} \\ \frac{M}{2^{n-1}}(C - C^+) + C^+, & \text{if } M > N/2 \end{cases}.$$

Once again, it can be seen that the division complexity can be reduced to either no division or dividing an integer (M) by a power-of-2 integer $2n^{-1}$, which can be easily implemented in hardware.

Regular Puncturing or Shortening Algorithms

Avoiding the costly division operator is not limited to the puncturing/shortening schemes used in the specific examples presented above. For any puncturing/shortening scheme that distributes the punctured/shortened bits between the two smaller code according to a fixed fraction or a fraction from a set of small size, avoiding division may be possible. To give an example consider a hypothetical puncturing scheme that out of M unpunctured code bits gives $M_0$ to the first code and $M_1 = 4M_0$ to the second code. For such a puncturing algorithm, the capacity computation becomes $$C_1 = \frac{1}{4}C^+ + \frac{3}{4}C.$$

Capacity Transform Function $f$

In some embodiments, the capacity transform function $f(C)$ is implemented using the BIAWGN assumption. With the BIAWGN assumption for each C, the SNR for which the capacity of BIAWGN channel is equal to C is determined. The SNR is multiplied by 2 to get $SNR^+ = 2SNR$. $f(C)$ is equal to the capacity of BIAWGN channel with $SNR = SNR^+$.

In some embodiments, for the sake of complexity reduction, this function is approximated with a polynomial of degree L:

$$f(C) = \Sigma_{i=0}^L \alpha_i C^i.$$

In a first example, with a binary erasure channel (BEC) assumption:

$$L=2, \alpha_0=0, \alpha_1=2, \alpha_2=-1$$

$$f(C) = 2C - C^2.$$

In a second example, for a degree-2 polynomial, fitting a degree-2 polynomial to the function obtained via a AWGN assumption yields:

$$L=2, \alpha_0=0.0053, \alpha_1=1.925, \alpha_2=-0.9277$$

$$f(C) = 0.0053 + 1.925C - 0.9277C^2.$$

In some embodiments, for the sake of low complexity implementation it desired that $f(C)$ is a polynomial $$f(C) = \sum_{i=0}^{L} k_i C^i$$

where $k_i$ are integers.

Figure 13:
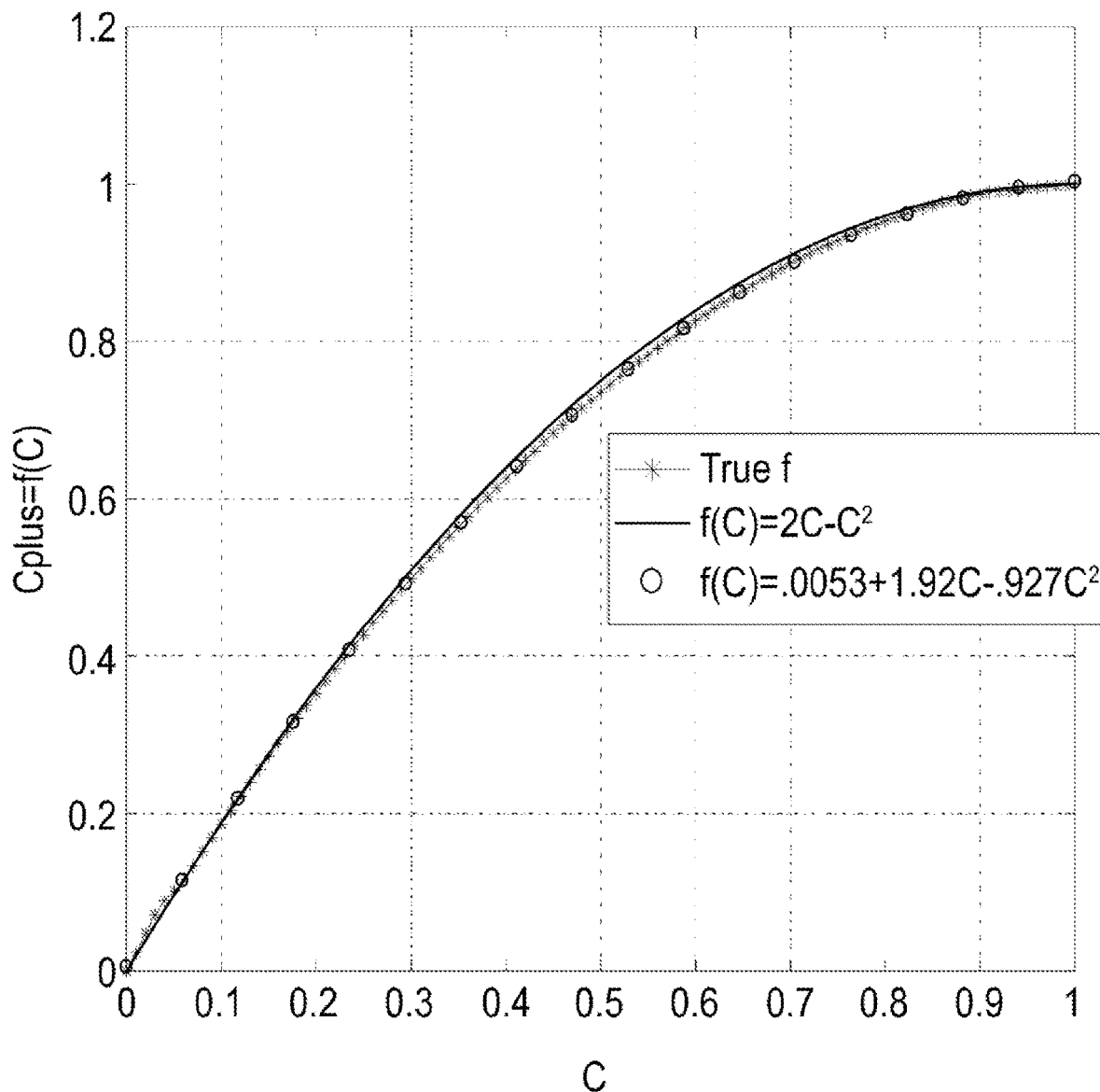
FIG. 13 is a plot of $C^+$ using a true f function, and two polynomial curve fitted approximations.

FIG. 13 shows the true $f$ function for a BIAWGN channel and the two simple approximating polynomials presented above.

Adaptive Punctured/Shortened-Dependent Short $Q_{P_i}^{(i)}$ Sequence

In some embodiments, the reliability sequences $Q_{P_i}^{(i)}$ are designed for each puncturing/shortening pattern P or S of the long code.

For block puncturing and shortening, and for BIV puncturing and shortening, the block or BIV puncturing and shortening with pattern P or S of the long code, will result in block or BIV puncturing/shortening of the short codes, i.e. the $P_i$ and $S_i$ follow the block or BIV pattern. In any of these four cases for each possible $P_i$ or $S_i$ (or $M_i$) one density evolution (DE)-optimized short sequence can be stored. Example sets of DE-GA (DE-Gaussian Approximation) optimized short sequences for $N_{ref}=16$ and different $M_i$ are presented in Table 1 and Table 2, but note that similar sequences can be obtained for larger $N_{ref}$ and shortening algorithms.

An unpunctured/unshortened polar code of length N will have a reliability sequence. If some coded bits are punctured/shortened, then reliability of the sub-channels change, i.e. the sequence Q changes. In otherword, a sub-channel i that is more reliable than sub-channel j before puncturing/shortening may become less reliable than sub-channel j after puncturing/shortening. Density evolution (DE) is a method that finds the reliability order of sub-channels for any given puncturing/shortening pattern. The DE designed sequence is better than the original sequence of an unpunctured/unshortend code. It is an optimized sequence for that puncturing/shortening pattern. Density-evolution Gaussian approximation (DE-GA) is an efficient low-complexity implementation of DE.

A first example is for BIV Puncturing with N=16, using puncturing order: [0, 8, 4, 12, 2, 10, 6, 14, 1, 9, 5, 13, 3, 11, 7, 15]. Table 1 shows the reliability sequences for different values of $M_i$.

TABLE 1

Short sequence example for $N_{ref}$ = 16, BIV puncturing

| $M_i$ | $Q_{M_i}^{(i)}$ |
|---|---|
| 16 | 0, 1, 2, 4, 8, 3, 5, 6, 9, 10, 12, 7, 11, 13, 14, 15 |
| 15 | 0, 1, 2, 4, 8, 3, 5, 6, 9, 10, 12, 7, 11, 13, 14, 15 |
| 14 | 8, 0, 1, 2, 4, 3, 9, 5, 10, 6, 12, 7, 11, 13, 14, 15 |
| 13 | 8, 4, 0, 1, 2, 5, 3, 12, 9, 6, 10, 7, 11, 13, 14, 15 |
| 12 | 12, 8, 4, 0, 1, 2, 5, 3, 9, 6, 10, 13, 7, 14, 11, 15 |
| 11 | 12, 8, 4, 2, 0, 1, 3, 6, 5, 10, 9, 7, 14, 13, 11, 15 |
| 10 | 12, 10, 8, 4, 2, 0, 1, 3, 6, 5, 9, 14, 7, 11, 13, 15 |
| 9 | 12, 10, 8, 6, 4, 2, 0, 1, 3, 5, 9, 14, 7, 11, 13, 15 |
| 8 | 14, 12, 10, 8, 6, 4, 2, 0, 1, 3, 5, 9, 7, 11, 13, 15 |
| 7 | 14, 12, 10, 8, 6, 4, 2, 1, 0, 3, 5, 9, 7, 11, 13, 15 |
| 6 | 14, 12, 10, 9, 8, 6, 4, 2, 1, 0, 3, 5, 11, 7, 13, 15 |
| 5 | 14, 12, 10, 9, 8, 6, 5, 4, 2, 1, 0, 3, 13, 7, 11, 15 |
| 4 | 14, 13, 12, 10, 9, 8, 6, 5, 4, 2, 1, 0, 3, 7, 11, 15 |
| 3 | 14, 13, 12, 10, 9, 8, 6, 5, 4, 3, 2, 1, 0, 7, 11, 15 |
| 2 | 14, 13, 12, 11, 10, 9, 8, 6, 5, 4, 3, 2, 1, 0, 7, 15 |
| 1 | 14, 13, 12, 11, 10, 9, 8, 7, 6, 5, 4, 3, 2, 1, 0, 15 |

For example, for any short sequence a punctured codeword length of $M_i$=8, the following reliability sequence is used to determining information bit locations:

| 8 | 14, 12, 10, 8, 6, 4, 2, 0, 1, 3, 5, 9, 7, 11, 13, 15 |
|---|---|

In a second example, block Puncturing with N=16 is used, with a puncturing order: [0, 1, 2, 3, 4, 5, 6, 7, 8, 9, 10, 11, 12, 13, 14, 15]. Table 2 shows reliability sequence examples for this example.

TABLE 2

Short sequence example for $N_{ref}$ = 16, block puncturing

| $M_i$ | $Q_{M_i}^{(i)}$ |
|---|---|
| 16 | 0, 1, 2, 4, 8, 3, 5, 6, 9, 10, 12, 7, 11, 13, 14, 15 |
| 15 | 0, 1, 2, 4, 8, 3, 5, 6, 9, 10, 12, 7, 11, 13, 14, 15 |
| 14 | 1, 0, 2, 4, 8, 3, 5, 6, 9, 10, 12, 7, 11, 13, 14, 15 |
| 13 | 2, 1, 0, 4, 8, 3, 5, 6, 9, 10, 12, 7, 11, 13, 14, 15 |
| 12 | 3, 2, 1, 0, 4, 8, 5, 6, 9, 10, 12, 7, 11, 13, 14, 15 |
| 11 | 4, 3, 2, 1, 0, 8, 5, 6, 9, 10, 12, 7, 11, 13, 14, 15 |
| 10 | 5, 4, 3, 2, 1, 0, 8, 6, 9, 10, 7, 12, 11, 13, 14, 15 |
| 9 | 6, 5, 4, 3, 2, 1, 0, 8, 7, 9, 10, 12, 11, 13, 14, 15 |
| 8 | 7, 6, 5, 4, 3, 2, 1, 0, 8, 9, 10, 12, 11, 13, 14, 15 |
| 7 | 8, 7, 6, 5, 4, 3, 2, 1, 0, 9, 10, 12, 11, 13, 14, 15 |
| 6 | 9, 8, 7, 6, 5, 4, 3, 2, 1, 0, 10, 12, 11, 13, 14, 15 |
| 5 | 10, 9, 8, 7, 6, 5, 4, 3, 2, 1, 0, 12, 11, 13, 14, 15 |
| 4 | 11, 10, 9, 8, 7, 6, 5, 4, 3, 2, 1, 0, 12, 13, 14, 15 |

TABLE 2-continued

Short sequence example for $N_{ref}$ = 16, block puncturing

| $M_i$ | $Q_{M_i}^{(i)}$ |
|---|---|
| 3 | 12, 11, 10, 9, 8, 7, 6, 5, 4, 3, 2, 1, 0, 13, 14, 15 |
| 2 | 13, 12, 11, 10, 9, 8, 7, 6, 5, 4, 3, 2, 1, 0, 14, 15 |
| 1 | 14, 13, 12, 11, 10, 9, 8, 7, 6, 5, 4, 3, 2, 1, 0, 15 |

Polar Code Construction Based on Puncturing Pattern Evolution

Another embodiment of the invention provides another method of constructing a polar code defined by K, M, N, P, where K is an input information vector bit length, N is a mother polar code length, M is an output codeword bit length after puncturing using a puncturing pattern P. The method involves using the one of the puncturing pattern evolution methods described above to identify disabled sub-channels, and then a reliability sequence is used to determine information bit positions from remaining sub-channels.

The method involves performing a plurality of iterations of polar code puncturing pattern evolution. The first iteration comprising performing polar code puncturing pattern evolution decomposition based on the puncturing pattern P (which may be any puncturing pattern, including a shortening pattern) to determine respective puncturing patterns $P_0$, $P_1$ for two polar codes of length N/2. Performing subsequent iterations involves performing two polar code puncturing pattern evolutions based on $P_0$, $P_1$, N=N/2 of the previous iteration, until N/2=1.

After the iterations, there are N polar codes of length 1 each corresponding to a respective input bit position, and for each input bit position, if the puncturing pattern of the corresponding length 1 polar code is one, that bit position is an information bit position, and if the puncturing pattern of the corresponding length 1 polar code is zero, that corresponds to a disabled input channel, and that bit is a frozen bit position. The iterations of puncturing pattern evolution serve to identify N-M frozen input bit positions. Then at least one reliability sequence is used to determine K information bit positions from among remaining M input bit positions.

For the more general puncturing case, determining respective puncturing patterns $P_0$, $P_1$ for two polar codes of length N/2 based on the puncturing pattern P is performed according to:

$$P_0 = P\left(1:\frac{N}{2}\right) \otimes P\left(\frac{N}{2}+1:N\right)$$

$$P_1 = P\left(1:\frac{N}{2}\right) \oplus P\left(\frac{N}{2}+1:N\right).$$

For the special case where the puncturing pattern is a shortening pattern, determining respective puncturing patterns $P_0$, $P_1$ for two polar codes of length N/2 based on the puncturing pattern P involves determining respective shortening patterns $S_0, S_1$ for the two polar codes of length N/2 based on the shortening pattern S performed according to:

$$S_0 = S(1:N/2) \oplus S(N/2+1:N)$$

$$S_1 = S\left(\frac{N}{2}+1:N\right).$$

Figure 14:
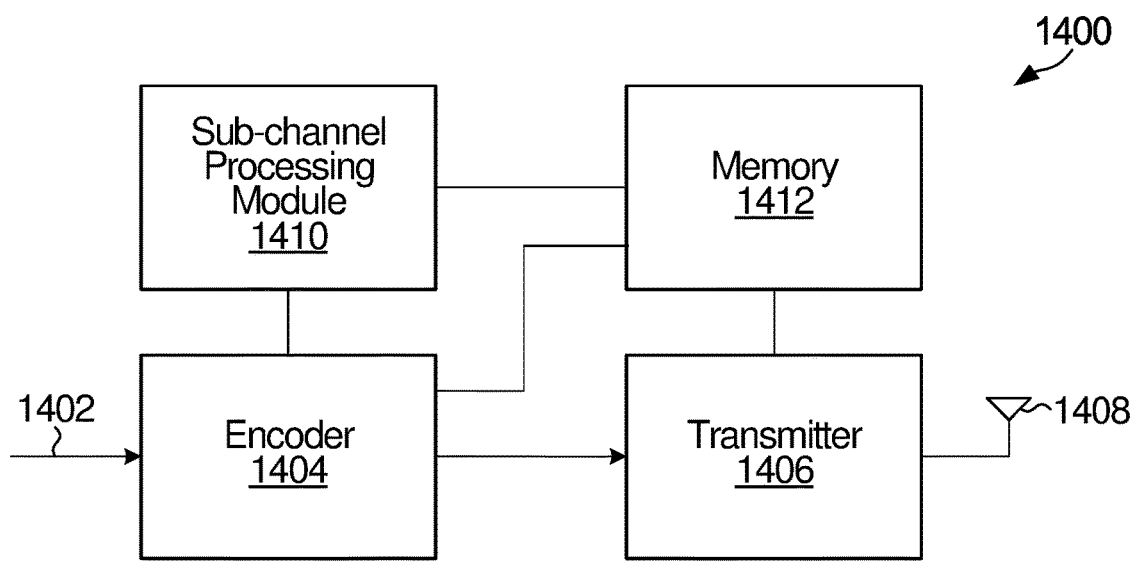
FIG. 14 is a block diagram of an apparatus for encoding and transmitting codewords.

FIG. 14 is a block diagram of an apparatus for encoding and transmitting codewords. The apparatus 1400 includes an encoder 1404 coupled to a transmitter 1406. The apparatus 1400 also includes a sub-channel processing module 1410 coupled to the encoder 1404. In the illustrated embodiment, the apparatus 1400 also includes an antenna 1408, coupled to the transmitter 1406, for transmitting signals over a wireless channel. In some embodiments, the transmitter 1406 includes a modulator, an amplifier, and/or other components of an RF transmit chain. A memory 1412 is also shown in FIG. 10, coupled to the encoder 1404, to the sub-channel processing module 1410, and to the transmitter 1406.

The encoder 1404 is implemented in circuitry, such as a processor, that is configured to encode input bits as disclosed herein. In a processor-based implementation of the encoder 1404, processor-executable instructions to configure a processor to perform encoding operations are stored in a non-transitory processor-readable medium. The non-transitory medium could include, in the memory 1412 for example, one or more solid-state memory devices and/or memory devices with movable and possibly removable storage media.

The sub-channel processing module 1410 is implemented in circuitry that is configured to determine (and store to the memory 1412) ordered number sequences or ordered sub-channel sequences as disclosed herein. The sub-channel processing module 1410 could be configured to also or instead determine coding parameters such as K or (N−K), and to select sub-channels as disclosed herein. In some embodiments, the sub-channel processing module 1410 is implemented using a processor. The same processor or other circuitry, or separate processors or circuitry, could be used to implement both the encoder 1404 and the sub-channel processing module 1410. As noted above for the encoder 1404, in a processor-based implementation of the sub-channel processing module 1410, processor-executable instructions to configure a processor to perform encoding operations are stored in a non-transitory processor-readable medium, in the memory 1412 for example.

The encoder 1404 is configured to encode, onto a number K of N sub-channels that are defined by a code and that have associated reliabilities for input bits at N input bit positions, input bits that are to be encoded. Information representing ordered sub-channel sequences, ordered number sequences, and/or selected sub-channels could be provided to the encoder 1404 by the sub-channel processing module 1410 for use in encoding input bits, and/or stored in the memory 1412 by the sub-channel processing module 1410 for subsequent use by the encoder.

The apparatus 1400 could implement any of various other features that are disclosed herein. For example, the encoder 1404, the transmitter 1406, and/or the sub-channel processing module 1410 could be configured to implement any one or more of punctured polar code construction methods described herein, and or to implement sub-channel selection in accordance with a polar code constructed using one of these methods.

In some alternative embodiments, the functionality of the encoder 1404, the transmitter 1406, and/or the sub-channel processing module 1410 described herein may be fully or partially implemented in software or modules, for example in encoding and transmitting modules stored in a memory such as 1412 and executed by a processor(s) of the apparatus 1400.

Figure 15:
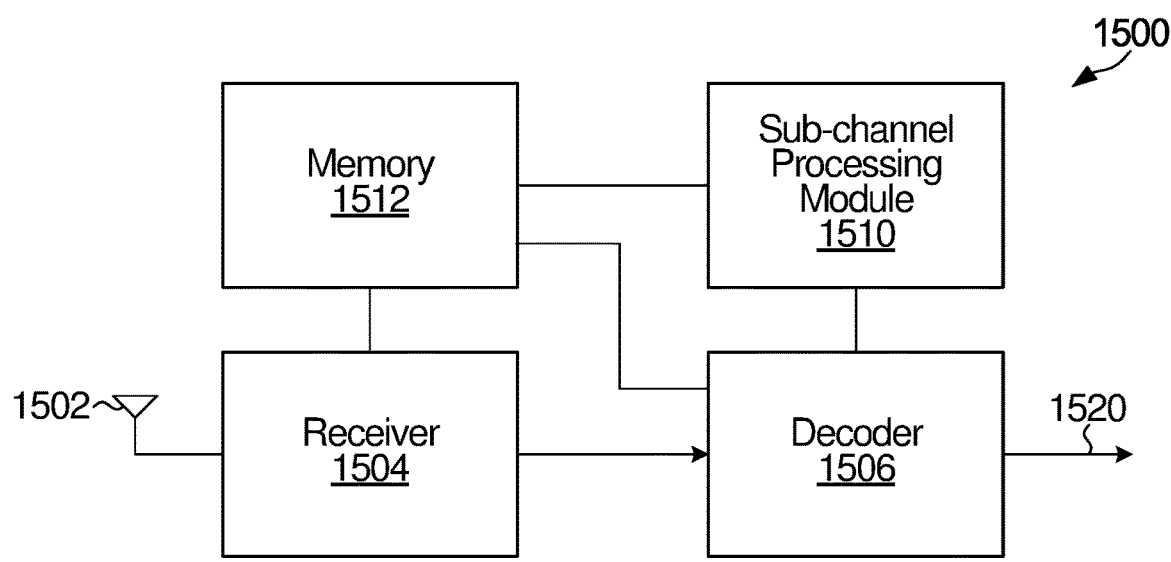
FIG. 15 is a block diagram of an example apparatus for receiving and decoding codewords.

FIG. 15 is a block diagram of an example apparatus for receiving and decoding codewords. The apparatus 1500 includes a receiver 1504 coupled to an antenna 1502 for receiving signals from a wireless channel, and to a decoder 1506. The apparatus 1500 also includes a sub-channel processing module 1510 coupled to the decoder 1506. A memory 1512 is also shown in FIG. 11, coupled to the decoder 1506, to the sub-channel processing module 1510, and to the receiver 1504.

In some embodiments, the receiver 1504 includes a demodulator, an amplifier, and/or other components of an RF receive chain. The receiver 1504 receives, via the antenna 1502, a word that is based on a codeword of a polar code. Decoded bits are output at 1515 for further receiver processing.

In some embodiments, the apparatus 1500, and similarly the apparatus 1400 in FIG. 14 as noted above, include a non-transitory computer readable medium at 1412, 1512 that includes instructions for execution by a processor to implement and/or control operation of the encoder 1404 and the sub-channel processing module 1410 in FIG. 14, to implement and/or control operation of the decoder 1506 and the sub-channel processing module 1510 in FIG. 15, and/or to otherwise control the execution of methods described herein. In some embodiments, the processor may be a component of a general-purpose computer hardware platform. In other embodiments, the processor may be a component of a special-purpose hardware platform. For example, the processor may be an embedded processor, and the instructions may be provided as firmware. Some embodiments may be implemented by using hardware only. In some embodiments, the instructions for execution by a processor may be embodied in the form of a software product. The software product may be stored in a non-volatile or non-transitory storage medium, which could be, for example, a compact disc read-only memory (CD-ROM), universal serial bus (USB) flash disk, or a removable hard disk, at 1412, 1512.

The decoder 1506 is implemented in circuitry that is configured to decode received codewords. The sub-channel processing module 1510 is implemented in circuitry that is configured to determine (and store to the memory 1412) ordered number sequences or ordered sub-channel sequences as disclosed herein. The sub-channel processing module 1410 could be configured to also or instead determine coding parameters such as K or (N−K), and to select sub-channels as disclosed herein. Information representing ordered sub-channel sequences, ordered number sequences, and/or the selected sub-channels could be provided to the decoder 1506 by the sub-channel processing module 1510 for use in decoding received words, and/or stored in the memory 1512 by the sub-channel processing module 1510 for subsequent use by the decoder.

In some alternative embodiments, the functionality of the receiver 1504, the decoder 1506, and/or the sub-channel processing module 1510 described herein may be fully or partially implemented in software or modules, for example in receiving and decoding modules stored in a memory 1512 and executed by a processor(s) of the apparatus 1500.

The apparatus 1500 could implement any of various other features that are disclosed herein. For example, the decoder 1506, the receiver 1504, and/or the sub-channel processing module 1510 could be configured to implement receiving/ decoding features corresponding to any one or more of the encoding/transmitting features noted above.

Communication equipment could include the apparatus 1400, the apparatus 1500, or both a transmitter and a receiver and both an encoder and a decoder. Such communication equipment could be user equipment or communication network equipment.

Figure 16:
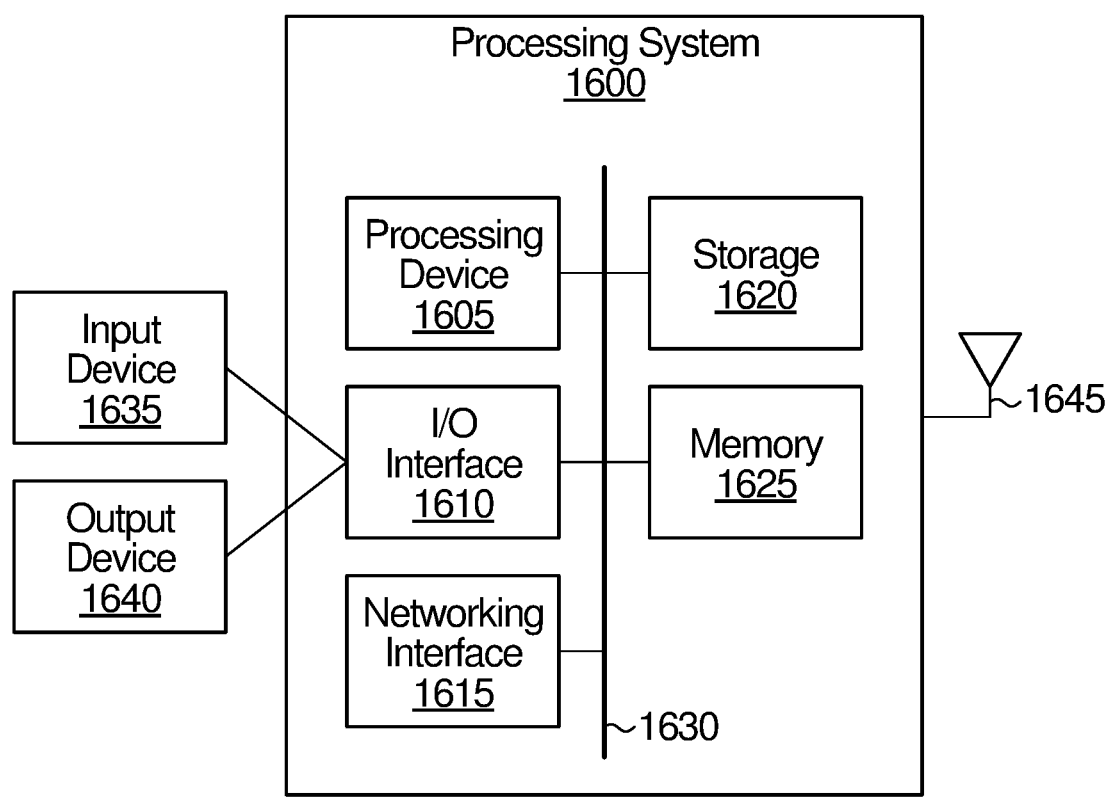
FIG. 16 is a block diagram of an example processing system, which may be used to implement embodiments disclosed herein.

FIGS. 14 and 15 are generalized block diagrams of apparatus that could be used to implement embodiments disclosed herein. FIG. 16 is a block diagram of an example processing system 1600, and provides a higher level implementation example. The apparatus 1400, the apparatus 1500, or both, may be implemented using the example processing system 1600, or variations of the processing system 1600. The processing system 1600 could be a server or a mobile device, for example, or any suitable processing system. Other processing systems suitable for implementing embodiments described in the present disclosure may be used, which may include components different from those discussed below. Although FIG. 16 shows a single instance of each component, there may be multiple instances of each component in the processing system 1600.

The processing system 1600 may include one or more processing devices 1605, such as a processor, a microprocessor, an application-specific integrated circuit (ASIC), a field-programmable gate array (FPGA), a dedicated logic circuitry, or combinations thereof. The processing system 1600 may also include one or more input/output (I/O) interfaces 1610, which may enable interfacing with one or more appropriate input devices 1635 and/or output devices 1640. The processing system 1600 may include one or more network interfaces 1615 for wired or wireless communication with a network (e.g., an intranet, the Internet, a P2P network, a WAN and/or a LAN) or other node. The network interfaces 1615 may include wired links (e.g., Ethernet cable) and/or wireless links (e.g., one or more antennas) for intra-network and/or inter-network communications. The network interfaces 1615 may provide wireless communication via one or more transmitters or transmit antennas and one or more receivers or receive antennas, for example. In this example, a single antenna 1645 is shown, which may serve as both transmitter and receiver. However, in other examples there may be separate antennas for transmitting and receiving. The processing system 1600 may also include one or more storage units 1620, which may include a mass storage unit such as a solid state drive, a hard disk drive, a magnetic disk drive and/or an optical disk drive.

The processing system 1600 may include one or more memories 1625, which may include a volatile or non-volatile memory (e.g., a flash memory, a random access memory (RAM), and/or a read-only memory (ROM)). The non-transitory memories 1625 may store instructions for execution by the processing devices 1605, such as to carry out examples described in the present disclosure. The memories 1625 may include other software instructions, such as for implementing an operating system and other applications/functions. In some examples, one or more data sets and/or modules may be provided by an external memory (e.g., an external drive in wired or wireless communication with the processing system 1600) or may be provided by a transitory or non-transitory computer-readable medium. Examples of non-transitory computer readable media include a RAM, a ROM, an erasable programmable ROM (EPROM), an electrically erasable programmable ROM (EEPROM), a flash memory, a CD-ROM, or other portable memory storage.

There may be a bus 1630 providing communication among components of the processing system 1600. The bus 1630 may be any suitable bus architecture including, for example, a memory bus, a peripheral bus or a video bus. In FIG. 16, the input devices 1635 (e.g., a keyboard, a mouse, a microphone, a touchscreen, and/or a keypad) and output devices 1640 (e.g., a display, a speaker and/or a printer) are shown as external to the processing system 1600. In other examples, one or more of the input devices 1635 and/or the output devices 1640 may be included as a component of the processing system 1600.

FIGS. 3B, 10B, and 14-16 are all illustrative of apparatuses in which embodiments of the present disclosure could be implemented. For example, an apparatus could include a polar code constructor and a polar code encoder as shown in FIGS. 3B and 10B, and a transmitter. A polar code constructor and a polar code encoder, or features thereof, could be implemented in the encoder 1404 in FIG. 14. In some embodiments, polar code construction could be implemented in a sub-channel processing module 1410 in FIG. 14. FIG. 16 represents an example of a processor-based embodiment, in which the processing device 1605 is configured, by executing software stored in the memory 1625, for example, to perform polar code construction and polar code encoding. References to a polar code constructor and a polar code encoder should be interpreted accordingly, to include embodiments that are implemented using an encoder, a sub-channel processing module, a processor, and/or other components, which could be configured to provide any or all of the polar code constructor and polar code encoder features disclosed herein.

A polar code constructor is configured to construct, for use in transmitting on a channel with a channel capacity C, a polar code. The polar code is defined by K, M, N, P, C, where K is an input information vector bit length, N is a mother polar code length, M is an output codeword bit length after puncturing using a puncturing pattern P, and C is a channel capacity. The polar code constructor is configured to construct the polar code by performing at least one iteration of polar code decomposition. Performing the first iteration involves performing code decomposition based on K, M, N, P, C defining the polar code, and performing subsequent iterations comprising two code decompositions based on $$\left(K = K_0, M = M_0, N = \frac{N}{2}, P = P_0, C = C_0\right),$$
$$\left(K = K_1, M = M_1, N = \frac{N}{2}, P, P_1, C = C_1\right)$$

of the previous iteration. Performing polar code decomposition involves determining respective input information vector bit lengths $K_0$ and $K_1$ for two partial polar codes of length N/2 based on the puncturing pattern P. The polar code constructor is further configured to construct the polar code by determining information bit positions for the polar code based on at least one reliability sequence and on the information bit lengths determined in a last of the at least one iteration of polar code decomposition.

A polar code encoder is configured, with the information bit positions determined in the last of the at least one iteration of polar code decomposition, to perform polar code encoding of a set of information bits using the constructed polar code. A transmitter, coupled to the polar code encoder, is configured to transmit based on a result of the polar code encoding over the channel using the constructed polar code.

A polar code constructor could be further configured to determine respective puncturing patterns $P_0$, $P_1$ for the two polar codes of length N/2 based on the puncturing pattern P.

Respective punctured codeword lengths $M_0$, $M_1$ could be determined for the two polar codes by a polar code constructor, based on the puncturing patterns.

In some embodiments, a polar code constructor is configured to determine respective capacities $C_0$, $C_1$ for the two polar codes based on the respective determined punctured codeword lengths and the channel capacity C.

The respective input information vector bit lengths $K_0$ and $K_1$ could be determined by a polar code constructor based on at least one of the determined punctured codeword lengths $M_0$, $M_1$ and at least one of the determined capacities $C_0$, $C_1$.

A polar code constructor could be further configured to determine a revised channel capacity for the physical channel and to update the polar code construction using the revised channel capacity. In such embodiments, a polar code encoder could be configured to encode using the updated polar code construction, and a transmitter could be configured to transmit using the updated polar code construction.

In some embodiments, a polar code constructor is further configured to update the constructed polar code based one or a combination of: Revised K; Revised N; Revised M; Revised P; Revised channel capacity.

A polar code constructor could be configured to perform iterations of polar code deconstruction in sequence for N=N, N/2, N/4, . . . $N/N_{ref}$, and to determine the information bit positions for the polar codes of length $N/N_{ref}$.

The puncturing pattern P could be a shortening pattern S, as in the embodiment shown by way of example in FIG. 10B.

Reliability sequences that are used in sub-channel selection could be determined or configured such that disabled sub-channels are determined to be frozen sub-channels.

In some embodiments, a the polar code constructor is further configured to determine disabled sub-channels by performing iterations of puncturing pattern evolution until puncturing patterns of length 1 are determined, with a puncturing pattern of 0 indicating a disabled sub-channel.

A polar code constructor could also or instead be configured to determine information bit positions for the polar code, based on at least one reliability sequence and on the information bit lengths determined in a last of the at least one iteration of polar code decomposition, by using a respective reliability sequence for each punctured codeword length determined in the last of the at least one iteration of polar code construction.

According to another aspect of the present disclosure, a polar code constructor is configured to construct, for communication over a channel, a polar code defined by K, N, P, where K is an input information vector bit length, N is a mother polar code length, and P is a puncturing pattern. The polar code constructor is configured to construct the polar code by performing at least one iteration of polar code decomposition. Performing the first iteration involves performing code decomposition based on K, N, P defining the polar code, and performing subsequent iterations involves two code decompositions based on $$\left(K = K_0, N = \frac{N}{2}\right), \left(K = K_1, N = \frac{N}{2}\right)$$

of the previous iteration. Performing polar code decomposition involves determining respective input information vector bit lengths $K_0$ and $K_1$ for two partial polar codes of length N/2 based on the puncturing pattern P. The polar code constructor is further configured to construct the polar code by determining information bit positions for the polar code based on at least one reliability sequence and on the information bit lengths determined in a last of the at least one iteration of polar code decomposition.

An apparatus that includes such a polar code constructor could also include a polar code encoder configured with the information bit positions determined in the last of the at least one iteration of polar code decomposition to perform polar code encoding of a set of information bits using the constructed polar code, and a transmitter, coupled to the polar code encoder, configured to transmit based on a result of the polar code encoding over the channel using the constructed polar code.

In some embodiments, the polar code is further defined by M, C, where M is an output codeword bit length after puncturing using the puncturing pattern P, and C is a channel capacity. In such embodiments a polar code constructor could be further configured to: perform code decomposition based on K, M, N, P, C defining the polar code, and perform subsequent iterations comprising two code decompositions based on $$\left(K = K_0, M = M_0, N = \frac{N}{2}, P = P_0, C = C_0\right),$$

$$\left(K = K_1, M = M_1, N = \frac{N}{2}, P, P_1, C = C_1\right)$$

of the previous iteration; determine respective puncturing patterns $P_0$, $P_1$ for the two polar codes of length N/2 based on the puncturing pattern P; determine respective punctured codeword lengths $M_0$, $M_1$ for the two polar codes based on the puncturing patterns; determine respective capacities $C_0$, $C_1$ for the two polar codes based on the respective determined punctured codeword lengths and the channel capacity C; and determine the respective input information vector bit lengths $K_0$ and $K_1$ based on at least one of the determined punctured codeword lengths $M_0$, $M_1$ and at least one of the determined capacities $C_0$, $c_1$.

Embodiments are disclosed herein primarily in the context of encoding and transmission. Polar code construction and decoding could be implemented at a receiver, such as in a polar code constructor and a polar code decoder; in the decoder 1506 in FIG. 15, in conjunction with a sub-channel processing module 1510 in some embodiments; and/or using a processor and a memory such as the processing device 1605 and the memory 1625 in FIG. 16, for example.

Figure 17:
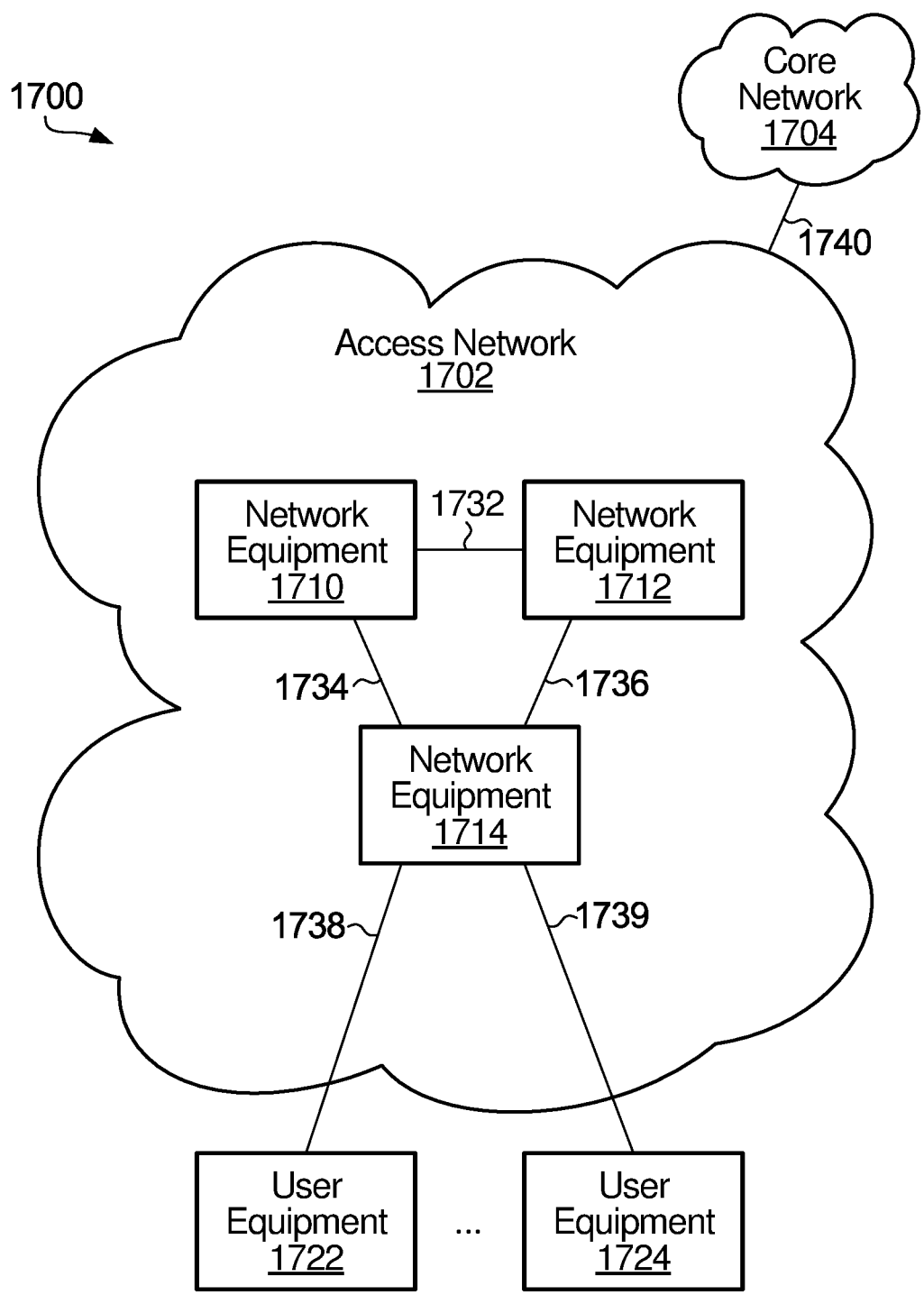
FIG. 17 is a block diagram of an example communication system.

FIG. 17 is a block diagram of an example communication system in which embodiments of the present disclosure could be implemented. The example communication system 1700 in FIG. 13 includes an access network 1702 and a core network 1704. The access network 1702 includes network equipment 2160, 1712, 1714 which communicates over network communication links 1732, 1734, 1736, and user equipment 1722, 1724 which communicates with network equipment 1714 in the example shown, over access communication links 1738, 1739. The access network 1702 communicates with the core network 1704 over another network communication link 1740. The core network 1704, like the access network 1702, may include network equipment that communicates with one or more installations of the network equipment 1710, 1712, 1714 in the access network 1702. However, in a communication system with an access network 1702 and a core network 1704, the core network might not itself directly provide communication service to user equipment.

The communication system 1700 is intended solely as an illustrative example. An access network 1702 could include more or fewer than three installations of network equipment, for example, which might or might not all directly communicate with each other as shown. Also, more than one installation of network equipment in the access network 1702 could provide communication service to user equipment. There could be more than one access network 1702 coupled to a core network 1704. It should also be appreciated that the present disclosure is not in any way limited to communication systems having an access network/core network structure.

Considering the access network 1702, any of various implementations are possible. The exact structure of network equipment 1710, 1712, 1714, and user equipment 1722, 1724 for which such network equipment provides communication service, is implementation-dependent. The apparatus 1400, 1500, 1600 in FIGS. 10 to 12 are examples of communication equipment that could be implemented at user equipment 1722, 1724 and/or network equipment 1710, 1712, 1714.

At least the network equipment 1714 that provides communication service to the user equipment 1722, 1724 includes a physical interface and communications circuitry to support access-side communications with the user equipment over the access links 1738, 1739. The access-side physical interface could be in the form of an antenna or an antenna array, for example, where the access communication links 1738, 1739 are wireless links. In the case of wired access communication links 1738, 1739, an access-side physical interface could be a port or a connector to a wired communication medium. Multiple access-side interfaces could be provided at the network equipment 1714 to support multiple access communication links 1738, 1739 of the same type or different types, for instance. The type of communications circuitry coupled to the access-side physical interface or interfaces at the access network equipment 1714 is dependent upon the type or types of access communication links 1738, 1739 and the communication protocol or protocols used to communicate with the user equipment 1722, 1724.

The network equipment 1710, 1712, 1714 also includes a network-side physical interface, or possibly multiple network-side physical interfaces, and communications circuitry to enable communications with other network equipment in the access network 1702. At least some installations of network equipment 1710, 1712, 1714 also include one or more network-side physical interfaces and communications circuitry to enable communications with core network equipment over the communication link 1740. There could be multiple communication links between network equipment 1710, 1712, 1714 and the core network 1704. Network-side communication links 1732, 1734, 1736 in the access network 1702, and the communication link 1740 to the core network 1704, could be the same type of communication link. In this case the same type of physical interface and the same communications circuitry at the network equipment 1710, 1712, 1714 could support communications between access network equipment within the access network 1702 and between the access network 1702 and the core network 1704. Different physical interfaces and communications circuitry could instead be provided at the network equipment 1710, 1712, 1714 for communications within the access network 1702 and between the access network 1702 and the core network 1704.

Network equipment in the core network 1704 could be similar in structure to the network equipment 1710, 1712, 1714. However, as noted above, network equipment in the core network 1704 might not directly provide communication service to user equipment and therefore might not include access-side physical interfaces for access communication links or associated access-side communications circuitry. Physical interfaces and communications circuitry at network equipment in the core network 1704 could support the same type or types of network communication link or links as in the access network 1702, different type or types of network communication link or links, or both.

Just as the exact structure of physical interfaces at network equipment 1710, 1712, 1714 and network equipment in the core network 1704 is implementation-dependent, the associated communications circuitry is implementation-dependent as well. In general, hardware, firmware, components which execute software, or some combination thereof, might be used in implementing such communications circuitry. Examples of electronic devices that might be suitable for implementing communications circuitry are provided above.

Each installation of user equipment 1722, 1724 includes a physical interface and communications circuitry compatible with an access-side physical interface and communications circuitry at the network equipment 1714, to enable the user equipment to communicate with the network equipment. Multiple physical interfaces of the same or different types could be provided at the user equipment 1722, 1724. The user equipment 1722, 1724 could also include such components as input/output devices through which functions of the user equipment are made available to a user. In the case of a wireless communication device such as a smartphone, for example, these functions could include not only communication functions, but other local functions which need not involve communications. Different types of user equipment 1722, 1724, such as different smartphones for instance, could be serviced by the same network equipment 1714.

Any of the communication links 1732, 1734, 1736, 1738, 1739, 1740, and communication links in the core network 1704 could potentially be or include wireless communication links. Such communication links tend to be used more often within an access network 1702 than in a core network 1704, although wireless communication links at the core network level are possible.

Various embodiments disclosed herein relate to constructing punctured polar codes using iterations of polar code decomposition. This could reduce memory space requirements for ordered sequence storage.

The previous description of some embodiments is provided to enable any person skilled in the art to make or use an apparatus, method, or processor readable medium according to the present disclosure.

Various modifications to the embodiments described herein may be readily apparent to those skilled in the art, and the generic principles of the methods and devices described herein may be applied to other embodiments. Thus, the present disclosure is not intended to be limited to the embodiments shown herein but is to be accorded the widest scope consistent with the principles and novel features disclosed herein.

For example, although embodiments are described primarily with reference to bits, other embodiments may involve non-binary and/or multi-bit symbols. If one sub-channel can transmit more than one bit, then several bits can be combined into a symbol in a defined alphabet, and a non-binary symbol is encoded for each sub-channel. Accordingly, polarization kernels are not limited to binary kernels. Symbol-level (Galois field) or non-binary kernels are also contemplated. A non-binary kernel could be preferred for its higher degree of polarization than a binary kernel. However, decoding computation complexity is higher for a non-binary kernel, because a decoder would handle symbols rather than bits.

Non-binary kernels possess characteristics of binary kernels. Furthermore, non-binary kernels could be combined or cascaded with binary kernels to form one polar code. Although the Arikan 2-by-2 binary kernel is used herein as an example, disclosed features may be extended to other types of polarization kernels.

The present disclosure refers primarily to a 2-by-2 kernel as example to demonstrate and explain illustrative embodiments. However, it is understood that the techniques for selecting sub-channels as disclosed herein could be applied to other types of polarization kernels as well, such as non-two prime number dimension kernels, non-primary dimension kernels, and/or higher dimension kernels formed by a combination of different (primary or non-primary) dimensions of kernels.

As noted above, polar codes have been selected for uplink and downlink eMBB control channel coding for the new 5G air interface, also known as the new 5G NR. The techniques disclosed herein could be used not only for control data over a control channel (e.g. PDCCH) but also or instead other types of data (e.g. user data) over any type of channel (e.g. a data channel).

The invention claimed is:

1. A method comprising:
for use in transmitting on a channel with a channel capacity C, constructing a polar code defined by K, M, N, P, C, where K is an input information vector bit length, N is a mother polar code length, M is an output codeword bit length after puncturing using a puncturing pattern P, and C is a channel capacity, the method comprising:
performing at least one iteration of polar code decomposition, performing the first iteration comprising performing code decomposition based on K, M, N, P, C defining the polar code, and performing subsequent iterations comprising two code decompositions based on $$\left(K = K_0, M = M_0, N = \frac{N}{2}, P = P_0, C = C_0\right),$$
$$\left(K = K_1, M = M_1, N = \frac{N}{2}, P = P_1, C = C_1\right)$$

of the previous iteration;
wherein performing polar code decomposition comprises:
determining respective puncturing patterns $P_0$, $P_1$ for two partial polar codes of length N/2 based on the puncturing pattern P;
determining respective punctured codeword lengths $M_0$, $M_1$ for the two partial polar codes based on the puncturing patterns; and
determining respective capacities $C_0$, $C_1$ for the two partial polar codes based on the respective determined punctured codeword lengths and the channel capacity C;
determining respective input information vector bit lengths $K_0$ and $K_1$ for the two partial polar codes of length N/2 based on the puncturing pattern P, at least one of the determined punctured codeword lengths $M_0$, $M_1$ and at least one of the determined capacities $C_0$, $C_1$; and
the method further comprising determining information bit positions for the polar code based on at least one reliability sequence and on the information bit lengths determined in a last of the at least one iteration of polar code decomposition;
polar code encoding a set of information bits to generate a codeword using a polar code encoder configured with the information bit positions of the polar code; and
transmitting at a transmitter, at least the codeword over the channel.

2. The method of claim 1 further comprising:
determining a revised channel capacity for the physical channel;
updating the polar code construction using the revised channel capacity;
encoding and transmitting using the updated polar code construction.

3. The method of claim 1 further comprising updating the constructed polar code based one or a combination of:
Revised K;
Revised N;
Revised M;
Revised P;
Revised channel capacity.

4. The method of claim 1 wherein performing at least one iteration of polar code deconstruction comprises performing iterations in sequence for N=N, N/2, N/4, ... N/$N_{ref}$, and wherein determining information bit positions is performed for the partial polar codes of length N/$N_{ref}$.

5. The method of claim 1 wherein the puncturing pattern P is a shortening pattern S.

6. The method of claim 5 wherein the reliability sequences are such that disabled sub-channels are determined to be frozen sub-channels.

7. The method of claim 6 further comprising determining disabled sub-channels by performing iterations of puncturing pattern evolution until puncturing patterns of length 1 are determined, with a puncturing pattern of 0 indicating a disabled sub-channel.

8. The method of claim 1 wherein determining information bit positions for the polar code based on at least one reliability sequence and on the information bit lengths determined in a last of the at least one iteration of polar code decomposition comprises:
using a respective reliability sequence for each punctured codeword length determined in the last of the at least one iteration of polar code construction.

9. A method of communication using a polar code defined by K, N, P, M, C, where M is an output codeword bit length after puncturing using the puncturing pattern P, C is a channel capacity, K is an input information vector bit length, and N is a mother polar code length, the method comprising:
polar code encoding a set of information bits to generate a codeword using a polar code encoder configured with the information bit positions of the polar code;

the polar code being defined based on at least one iteration of polar code decomposition based on K, M, N, P, C, subsequent iterations comprising two code decompositions based on $$\left(K = K_0, M = M_0, N = \frac{N}{2}, P = P_0, C = C_0\right),$$
$$\left(K = K_1, M = M_1, N = \frac{N}{2}, P = P_1, C = C_1\right)$$

of the previous iteration;
wherein polar code decomposition comprises:
determining respective puncturing patterns $P_0$, $P_1$ for two partial polar codes of length N/2 based on the puncturing pattern P;
determining respective punctured codeword lengths $M_0$, $M_1$ for the two partial polar codes based on the puncturing patterns; and
determining respective capacities $C_0$, $C_1$ for the two partial polar codes based on the respective determined punctured codeword lengths and the channel capacity C;
determining respective input information vector bit lengths $K_0$ and $K_1$ for the two partial polar codes of length N/2 based on the puncturing pattern P, at least one of the determined punctured codeword lengths $M_0$, $M_1$ and at least one of the determined capacities $C_0$, $C_1$; and
information bit positions for the polar code being defined based on at least one reliability sequence and on the information bit lengths determined in a last of the at least one iteration of the polar code decomposition; and
transmitting at a transmitter the codeword over the channel.

10. An apparatus comprising:
a polar code constructor configured to construct, for use in transmitting on a channel with a channel capacity C, a polar code defined by K, M, N, P, C, where K is an input information vector bit length, N is a mother polar code length, M is an output codeword bit length after puncturing using a puncturing pattern P, and C is a channel capacity, by:
performing at least one iteration of polar code decomposition, performing the first iteration comprising performing code decomposition based on K, M, N, P, C defining the polar code, and performing subsequent iterations comprising two code decompositions based on $$\left(K = K_0, M = M_0, N = \frac{N}{2}, P = P_0, C = C_0\right),$$
$$\left(K = K_1, M = M_1, N = \frac{N}{2}, P = P_1, C = C_1\right)$$

of the previous iteration,
wherein performing polar code decomposition comprises:
determining respective puncturing patterns $P_0$, $P_1$ for two partial polar codes of length N/2 based on the puncturing pattern P;
determining respective punctured codeword lengths $M_0$, $M_1$ for the two partial polar codes based on the puncturing patterns;
determining respective capacities $C_0$, $C_1$ for the two partial polar codes based on the respective determined punctured codeword lengths and the channel capacity C; and
determining respective input information vector bit lengths $K_0$ and $K_1$ for the two partial polar codes of length N/2 based on the puncturing pattern P, at least one of the determined punctured codeword lengths M0, M1 and at least one of the determined capacities C0,C1; and
determining information bit positions for the polar code based on at least one reliability sequence and on the information bit lengths determined in a last of the at least one iteration of polar code decomposition;
a polar code encoder configured with the information bit positions determined in the last of the at least one iteration of polar code decomposition to perform polar code encoding of a set of information bits to generate a codeword using the constructed polar code;
a transmitter, coupled to the polar code encoder, configured to transmit at least the codeword over the channel using the constructed polar code.

11. The apparatus of claim 10,
wherein the polar code constructor is further configured to determine a revised channel capacity for the physical channel and to update the polar code construction using the revised channel capacity;
wherein the polar code encoder is configured to encode using the updated polar code construction; and
wherein the transmitter is configured to transmit using the updated polar code construction.

12. The apparatus of claim 10 wherein the polar code constructor is further configured to update the constructed polar code based one or a combination of:
Revised K;
Revised N;
Revised M;
Revised P;
Revised channel capacity.

13. The apparatus of claim 10 wherein the polar code constructor is configured to perform iterations of polar code deconstruction in sequence for N=N, N/2, N/4, . . . N/$N_{ref}$ and to determine the information bit positions for the partial polar codes of length N/$N_{ref}$.

14. The apparatus of claim 10 wherein the puncturing pattern P is a shortening pattern S.

15. The apparatus of claim 14 wherein the reliability sequences are such that disabled sub-channels are determined to be frozen sub-channels.

16. The apparatus of claim 15 wherein the polar code constructor is further configured to determine disabled sub-channels by performing iterations of puncturing pattern evolution until puncturing patterns of length 1 are determined, with a puncturing pattern of 0 indicating a disabled sub-channel.

17. The apparatus of claim 10 wherein the polar code constructor is configured to determine information bit positions for the polar code based on at least one reliability sequence and on the information bit lengths determined in a last of the at least one iteration of polar code decomposition by:
using a respective reliability sequence for each punctured codeword length determined in the last of the at least one iteration of polar code construction.

18. An apparatus comprising:
a polar code encoder configured to perform polar code encoding of a set of information bits to generate a codeword using a polar code;
the polar code being defined based on at least one iteration of polar code decomposition based on K, N, P, M, C, where M is an output codeword bit length after puncturing using the puncturing pattern P, C is a channel capacity K is an input information vector bit length, and N is a mother polar code length,
wherein polar code decomposition comprises at least one iteration of polar code decomposition;
a first iteration comprising code decomposition based on K, M, N, P, C defining the polar code, and
subsequent iterations comprising two code decompositions based on $$\left(K=K_0, M=M_0, N=\frac{N}{2}, P=P_0, C=C_0\right),$$

$$\left(K=K_1, M=M_1, N=\frac{N}{2}, P=P_1, C=C_1\right)$$

of the previous iteration;
respective puncturing patterns P0, P1 for two partial polar codes of length N/2 being determined based on the puncturing pattern P;
respective punctured codeword lengths M0, M1 for the two partial polar codes being determined based on the puncturing patterns;
respective capacities C0, C1 for the two partial polar codes being determined based on the respective determined punctured codeword lengths and the channel capacity C; and
respective input information vector bit lengths $K_0$ and $K_1$ for the two partial polar codes of length N/2 being determined based on the puncturing pattern P, at least one of the determined punctured codeword lengths $M_0$, $M_1$ and at least one of the determined capacities $C_0$, $C_1$; and
information bit positions for the polar code being defined based on at least one reliability sequence and on the information bit lengths determined in a last of the at least one iteration of polar code decomposition; and
a transmitter, coupled to the polar code encoder, configured to transmit at least the codeword over the channel.

* * * * *

UNITED STATES PATENT AND TRADEMARK OFFICE
CERTIFICATE OF CORRECTION

PATENT NO. : 10,651,973 B2
APPLICATION NO. : 15/921010
DATED : May 12, 2020
INVENTOR(S) : Yiqun Ge and Hamid Saber Page 1 of 1

It is certified that error appears in the above-identified patent and that said Letters Patent is hereby corrected as shown below:

In the Claims

In Column 48, Line 22-23 (Claim 10): "transmit at least the codeword over the channel using the constructed polar code." should read --transmit at least the codeword over the channel--.

Signed and Sealed this
Twenty-second Day of June, 2021

Drew Hirshfeld
*Performing the Functions and Duties of the*
*Under Secretary of Commerce for Intellectual Property and*
*Director of the United States Patent and Trademark Office*